United States Patent
Zheng et al.

(10) Patent No.: US 11,927,818 B2
(45) Date of Patent: Mar. 12, 2024

(54) OPTICAL MODULE

(71) Applicant: Hisense Broadband Multimedia Technologies Co., Ltd., Shandong (CN)

(72) Inventors: Long Zheng, Shandong (CN); Sigeng Yang, Shandong (CN)

(73) Assignee: HISENSE BROADBAND MULTIMEDIA TECHNOLOGIES CO., LTD., Shandong (CN)

(*) Notice: Subject to any disclaimer, the term of this patent is extended or adjusted under 35 U.S.C. 154(b) by 358 days.

(21) Appl. No.: 17/364,322

(22) Filed: Jun. 30, 2021

(65) Prior Publication Data

US 2021/0325617 A1   Oct. 21, 2021

Related U.S. Application Data

(63) Continuation-in-part of application No. PCT/CN2020/080413, filed on Mar. 20, 2020.

(30) Foreign Application Priority Data

Dec. 20, 2019 (CN) .......................... 201911328070.9
Dec. 20, 2019 (CN) .......................... 201911330223.3
(Continued)

(51) Int. Cl.
*G02B 6/38* (2006.01)
*G02B 6/42* (2006.01)
(Continued)

(52) U.S. Cl.
CPC ......... *G02B 6/4281* (2013.01); *G02B 6/3885* (2013.01); *G02B 6/389* (2013.01);
(Continued)

(58) Field of Classification Search
CPC ................................ G02B 6/38; G02B 6/43
(Continued)

(56) References Cited

U.S. PATENT DOCUMENTS 9,835,804 B2    12/2017  Barwicz et al.
2001/0017964 A1  8/2001  Setoguchi
(Continued)

FOREIGN PATENT DOCUMENTS

CN    101986178 A    3/2011
CN    103323916 A    9/2013
(Continued)

OTHER PUBLICATIONS

Office Action issued in corresponding Chinese Patent Application No. 201911330701.0 dated Oct. 27, 2021, with English translation.
(Continued)

*Primary Examiner* — Kaveh C Kianni
(74) *Attorney, Agent, or Firm* — Morgan, Lewis & Bockius LLP

(57) ABSTRACT

An optical module has an optical port and an electrical port, and includes a shell, a circuit board, a circuit adapter board, a silicon optical chip, a light source and an optical fiber socket. The circuit board is disposed in the shell. One end of the circuit board is provided with a connecting finger located in the electrical port. The circuit adapter board is disposed on and electrically connected to the circuit board. A thermal expansion coefficient of the circuit adapter board is lower than that of the circuit board. The silicon optical chip is disposed on and electrically connected to the circuit adapter board. The light source is disposed on the circuit board, is electrically connected to the circuit board, and is optically connected to the silicon optical chip. The optical fiber socket is optically connected to the silicon optical chip, and is configured to form the optical port.

20 Claims, 14 Drawing Sheets

(30) Foreign Application Priority Data

Dec. 20, 2019 (CN) .......................... 201911330695.9
Dec. 20, 2019 (CN) .......................... 201911330701.0

(51) Int. Cl.
*G02B 6/43* (2006.01)
*G02B 6/12* (2006.01)

(52) U.S. Cl.
CPC .............. *G02B 6/43* (2013.01); *G02B 6/1203* (2013.01); *G02B 6/387* (2013.01)

(58) Field of Classification Search
USPC .......................................................... 385/24
See application file for complete search history.

(56) References Cited

U.S. PATENT DOCUMENTS

| | | |
|---|---|---|
| 2011/0026558 A1 | 2/2011 | Raju et al. |
| 2015/0055948 A1 | 2/2015 | Butler et al. |
| 2016/0377823 A1 | 12/2016 | Garland et al. |
| 2017/0279537 A1 | 9/2017 | Kim et al. |
| 2018/0172929 A1 | 6/2018 | Hu et al. |
| 2019/0379177 A1 | 12/2019 | Menezo et al. |

FOREIGN PATENT DOCUMENTS

| | | | |
|---|---|---|---|
| CN | 103383483 | A | 11/2013 |
| CN | 104503043 | A | 4/2015 |
| CN | 105403966 | A | 3/2016 |
| CN | 105659131 | A | 6/2016 |
| CN | 106597614 | A | 4/2017 |
| CN | 106772835 | A | 5/2017 |
| CN | 206441716 | U | 8/2017 |
| CN | 107479147 | A | 12/2017 |
| CN | 206833030 | U | 1/2018 |
| CN | 107942451 | A | 4/2018 |
| CN | 108700707 | A | 10/2018 |
| CN | 108761668 | A | 11/2018 |
| CN | 109239861 | A | 1/2019 |
| CN | 109669248 | A | 4/2019 |
| CN | 109841600 | A | 6/2019 |
| CN | 109884754 | A | 6/2019 |
| CN | 110208916 | A | 9/2019 |
| CN | 110388576 | A | 10/2019 |
| CN | 110581436 | A | 12/2019 |
| JP | 2002-232054 | A | 8/2002 |

OTHER PUBLICATIONS

Office Action issued in corresponding Chinese Patent Application No. 201911330695.9 dated Oct. 26, 2021, with English translation.
Office Action issued in corresponding Chinese Patent Application No. 201911330223.3 dated Oct. 13, 2021, with English translation.
Office Action issued in corresponding Chinese Patent Application No. 201911328070.9 dated Oct. 18, 2021, with English translation.
International Search Report and Written Opinion issued in corresponding International Application No. PCT/CN2020/080413 dated Nov. 2, 2020, with English translation.
Office Action issued in corresponding Chinese Patent Application No. 201911330701.0 dated Apr. 22, 2022, with English translation.
Office Action issued in corresponding Chinese Patent Application No. 201911330695.9 dated Apr. 27, 2022, with English translation.

OPTICAL MODULE

CROSS-REFERENCE TO RELATED APPLICATIONS

This application is a continuation in part of International Patent Application No. PCT/CN2020/080413 filed on Mar. 20, 2020, which claims priority to Chinese Patent Application No. 201911330223.3, filed on Dec. 20, 2019, Chinese Patent Application No. 201911328070.9, filed on Dec. 20, 2019, Chinese Patent Application No. 201911330695.9, filed on Dec. 20, 2019, and Chinese Patent Application No. 201911330701.0, filed on Dec. 20, 2019, which are incorporated herein by reference in their entireties.

TECHNICAL FIELD

The present disclosure relates to the field of optical communication technologies, and in particular, to an optical module.

BACKGROUND

Optical communication technologies are used in new services and applications such as cloud computing, mobile Internet, video conference. In optical communication, an optical module is a tool for achieving interconversion between an optical signal and an electrical signal, and is one of key components in an optical communication device. At present, the use of a silicon optical chip to achieve the interconversion between the optical signal and the electrical signal has become a mainstream solution adopted by a high-speed optical module.

SUMMARY

An optical module is provided. The optical module has an optical port and an electrical port, and includes a shell, a circuit board, a circuit adapter board, a silicon optical chip, a light source and an optical fiber socket. The circuit board is disposed in the shell, an end of the circuit board is provided with a connecting finger, and the connecting finger is located in the electrical port. The circuit adapter board is disposed on the circuit board and is electrically connected to the circuit board. A thermal expansion coefficient of the circuit adapter board is lower than that of the circuit board. The silicon optical chip is disposed on the circuit adapter board and is electrically connected to the circuit adapter board. The light source is disposed on the circuit board, is electrically connected to the circuit board, and is optically connected to the silicon optical chip. The optical fiber socket is optically connected to the silicon optical chip, and is configured to form the optical port.

BRIEF DESCRIPTION OF THE DRAWINGS

In order to describe technical solutions in the present disclosure more clearly, accompanying drawings to be used in the description of some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual dimensions of products, actual processes of methods and actual timings of signals involved in the embodiments of the present disclosure.

DETAILED DESCRIPTION

Figure 1A:
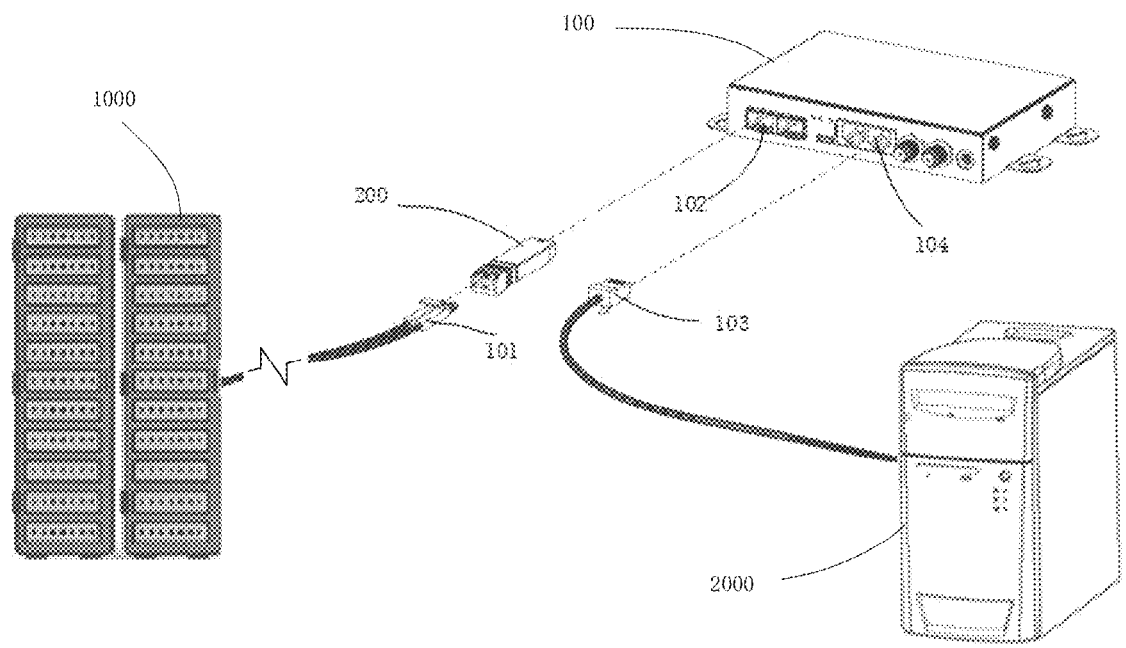
FIG. 1A is a schematic diagram showing a connection relationship of an optical communication system, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on the basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" and "second" may explicitly or implicitly include one or more of the features. In the description of the embodiments of the present disclosure, the term "a plurality of" means two or more unless otherwise specified.

In the description of some embodiments, the term "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of "adapted to" or "configured to" herein implies an open and inclusive expression that does not exclude devices adapted to or configured to perform additional tasks or steps.

The term "about", "substantially" and "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views that are schematic illustrations of idealized embodiments. In the drawings, thicknesses of layers and regions may be enlarged for clarity. Therefore, variations in a shape with respect to the drawings due to, for example, manufacturing technology and/or tolerances may be envisaged. Therefore, exemplary embodiments should not be construed as being limited to the shapes of the regions as illustrated herein, but include deviations in shapes due to, for example, manufacturing. For example, an etched region shown as a rectangle will generally have curved features. Therefore, the regions shown in the drawings are schematic in nature, and their shapes are not intended to show the actual shapes of the regions of the device, and are not intended to limit the scope of the exemplary embodiments.

In optical communication technology, an optical signal is used to carry information to be transmitted, and the optical signal carrying the information is transmitted to an information processing device such as a computer through an information transmission device such as an optical fiber or an optical waveguide to complete the transmission of the information. Since the optical signal has a characteristic of passive transmission when being transmitted through the optical fiber or the optical waveguide, low-cost and low-loss information transmission may be achieved. In addition, a signal transmitted by the information transmission device such as the optical fiber or the optical waveguide is an optical signal, while a signal that can be recognized and processed by the information processing device such as the computer is an electrical signal. Therefore, in order to establish information connection between the information transmission device such as the optical fiber or the optical waveguide and the information processing device such as the computer, interconversion between the electrical signal and the optical signal needs to be achieved.

An optical module implements a function of interconversion between the optical signal and the electrical signal in the field of optical fiber communication technology. The optical module includes an optical port and an electrical port. The optical port is configured to implement optical communication between the optical module and the information transmission device such as the optical fiber or the optical waveguide. The electrical port is configured to implement electrical connection between the optical module and an optical network terminal (e.g., an optical modem). The electrical connection is mainly to implement power supply, transmission of an I2C signal, transmission of a data signal and grounding. The optical network terminal transmits the electrical signal to the information processing device such as the computer through a network cable or wireless fidelity (Wi-Fi).

Figure 1B:
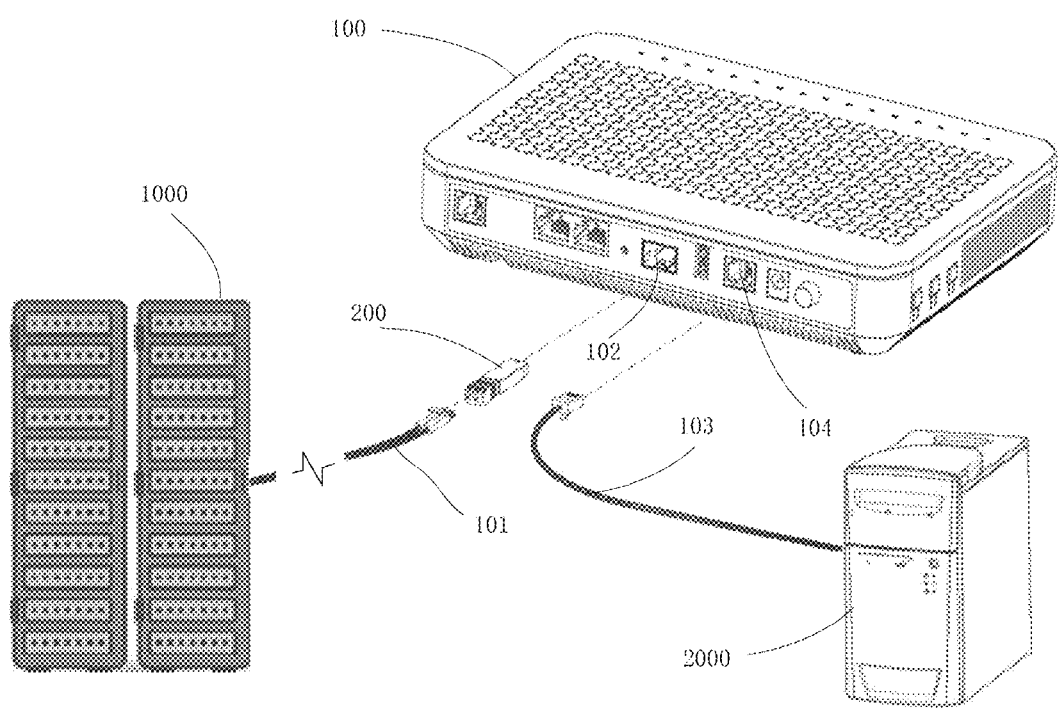
FIG. 1B is a schematic diagram showing a connection relationship of another optical communication system, in accordance with some embodiments.

FIG. 1A is a schematic diagram showing a connection relationship of an optical communication system in accordance with some embodiments, and FIG. 1B is a schematic diagram showing a connection relationship of another optical communication system in accordance with some embodiments. As shown in FIGS. 1A and 1B, the optical communication system mainly includes a remote server 1000, a local information processing device 2000, an optical network terminal 100, an optical module 200, an optical fiber 101 and a network cable 103.

One terminal of the optical fiber 101 is connected to the remote server 1000, and the other terminal thereof is connected to the optical network terminal 100 through the optical module 200. The optical fiber itself may support long-distance signal transmission, such as several-kilometer (6-kilometer to 8-kilometer) signal transmission. On this basis, if a repeater is used, infinite-distance transmission may be achieved theoretically. Therefore, in a typical optical communication system, a distance between the remote server 1000 and the optical network terminal 100 may typically reach several kilometers, tens of kilometers, or hundreds of kilometers.

One terminal of the network cable 103 is connected to the local information processing device 2000, and the other terminal thereof is connected to the optical network terminal 100. The local information processing device 2000 is at least one of the followings: a router, a switch, a computer, a mobile phone, a tablet computer or a television.

A physical distance between the remote server 1000 and the optical network terminal 100 is greater than a physical distance between the local information processing device 2000 and the optical network terminal 100. Connection between the local information processing device 2000 and the remote server 1000 is completed by the optical fiber 101 and the network cable 103; and connection between the optical fiber 101 and the network cable 103 is completed by the optical module 200 and the optical network terminal 100.

The optical module 200 includes an optical port and an electrical port. The optical port is configured to access the optical fiber 101, so that the optical module 200 and the optical fiber 101 establish bidirectional optical signal connection; and the electrical port is configured to access the optical network terminal 100, so that the optical module 200 and the optical network terminal 100 establish bidirectional electrical signal connection. Interconversion between the optical signal and the electrical signal is achieved by the optical module 200, so that information connection between the optical fiber 101 and the optical network terminal 100 is established. An optical signal from the optical fiber 101 is converted into an electrical signal by the optical module 200 and then the electrical signal is input into the optical network terminal 100, and an electrical signal from the optical network terminal 100 is converted into an optical signal by the optical module 200 and then the optical signal is input into the optical fiber 101. Since the optical module 200 is a tool for achieving the interconversion between the optical signal and the electrical signal, and has no function of processing data, the information does not change in the above photoelectric conversion process.

The optical network terminal 100 includes a housing in a substantially cuboid shape, and an optical module interface 102 and a network cable interface 104 that are disposed on the housing. The optical module interface 102 is configured to access the optical module 200, so that the bidirectional electrical signal connection between the optical network terminal 100 and the optical module 200 is established; and the network cable interface 104 is configured to access the network cable 103, so that the bidirectional electrical signal connection between the optical network terminal 100 and the network cable 103 is established. That is, connection between the optical module 200 and the network cable 103 is established through the optical network terminal 100. The optical network terminal 100 transmits an electrical signal from the optical module 200 to the network cable 103, and transmits an electrical signal from the network cable 103 to the optical module 200. Therefore, the optical network terminal 100, as a master monitor of the optical module 200, may monitor operation of the optical module 200. In addition to the optical network terminal 100, the master monitor of the optical module 200 may further include an optical line terminal (OLT).

A bidirectional signal transmission channel between the remote server 1000 and the local information processing device 2000 has been established through the optical fiber 101, the optical module 200, the optical network terminal 100 and the network cable 103.

Figure 2:
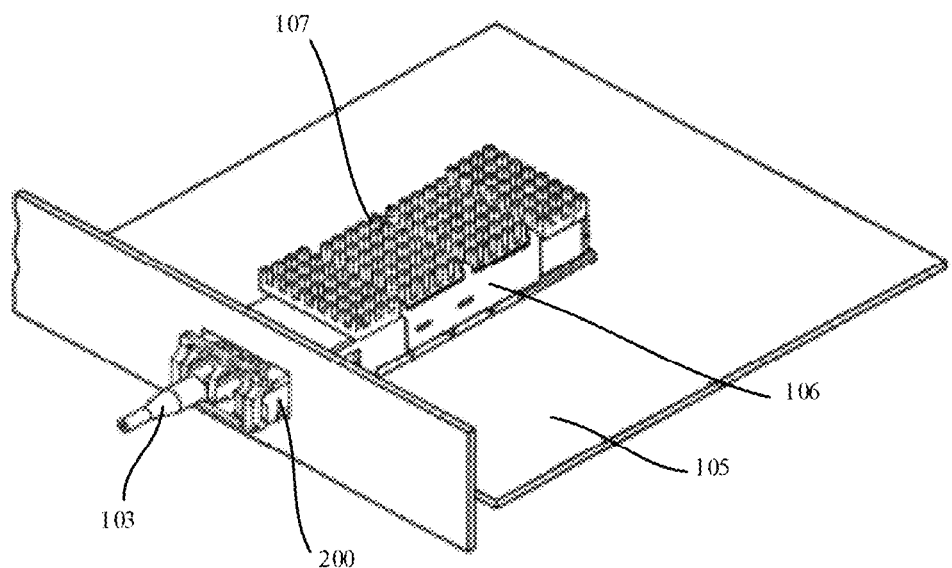
FIG. 2 is a schematic diagram showing a structure of an optical network terminal, in accordance with some embodiments.

FIG. 2 is a schematic diagram showing a structure of an optical network terminal in accordance with some embodiments. In order to clearly show a connection relationship between the optical module 200 and the optical network terminal 100, FIG. 2 only shows a structure of the optical network terminal 100 related to the optical module 200. As shown in FIG. 2, the optical network terminal 100 further includes a circuit board 105 disposed in the housing thereof, a cage 106 disposed on a surface of the circuit board 105, a heat sink 107 disposed on the cage 106, and an electrical connector disposed inside the cage 106. The electrical connector is configured to access the electrical port of the optical module 200; and the heat sink 107 has protruding portions such as fins that increase a heat dissipation area.

The optical module 200 is inserted into the cage 106 of the optical network terminal 100, the optical module 200 is fixed by the cage 106, and heat generated by the optical module 200 is conducted to the cage 106 and is dissipated through the heat sink 107. After the optical module 200 is inserted into the cage 106, the electrical port of the optical module 200 is connected to the electrical connector inside the cage 106, so that the bidirectional electrical signal connection between the optical module 200 and the optical network terminal 100 is established. In addition, the optical port of the optical module 200 is connected to the optical fiber 101, so that the bidirectional optical signal connection between the optical module 200 and the optical fiber 101 is established.

Figure 3:
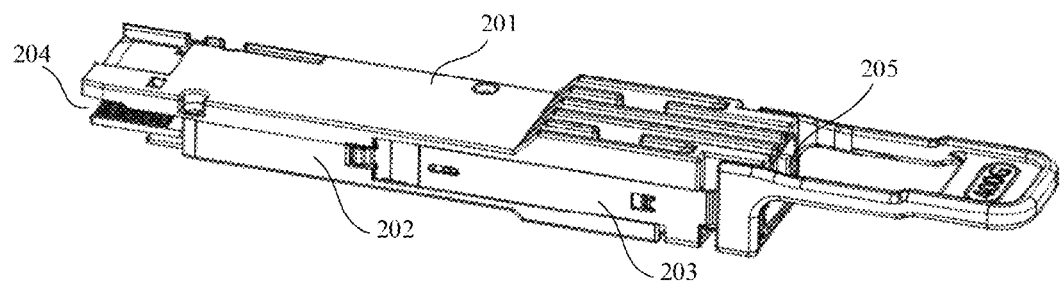
FIG. 3 is a schematic diagram showing a structure of an optical module, in accordance with some embodiments.
Figure 4:
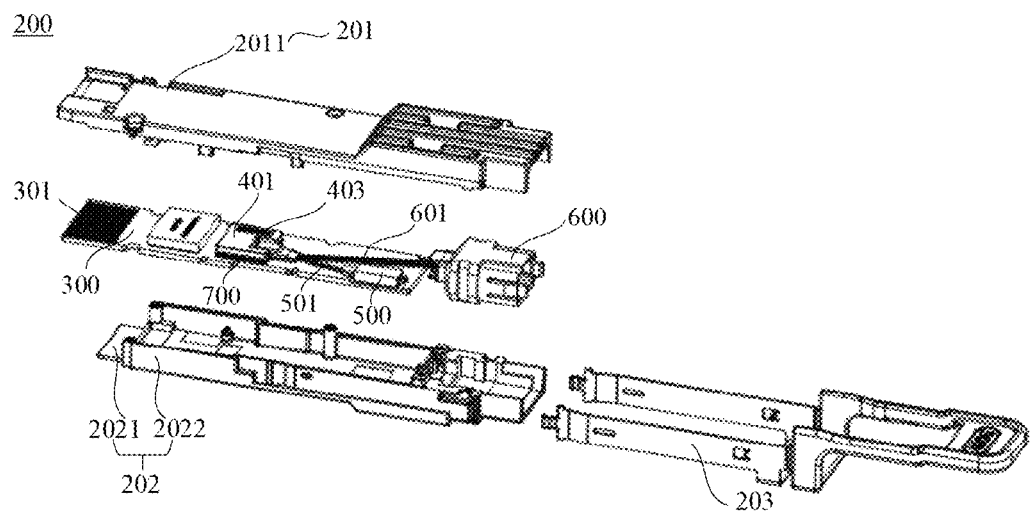
FIG. 4 is a schematic diagram showing an exploded structure of the optical module shown in FIG. 3.

FIG. 3 is a schematic diagram showing a structure of an optical module in accordance with some embodiments, and FIG. 4 is a schematic diagram of an exploded structure of the optical module shown in FIG. 3. As shown in FIGS. 3 and 4, the optical module 200 includes a shell, a circuit board 300 disposed in the shell, a circuit adapter board 700 disposed on the circuit board 300, a silicon optical chip 403 disposed on the circuit adapter board 700, and a light source 500 disposed on the circuit board 300.

The shell includes an upper shell 201 and a lower shell 202. The upper shell 201 covers the lower shell 202 to form the above shell with two openings, and an outer contour of the shell is generally in a cuboid shape.

In some embodiments, the lower shell 202 includes a bottom plate 2021 and two lower side plates 2022 located on both sides of the bottom plate 2021 respectively and disposed perpendicular to the bottom plate 2021; and the upper shell 201 includes a cover plate 2011, and the cover plate 2011 covers the two lower side plates 2022 of the lower shell 202 to form the above shell.

In some other embodiments, the lower shell 202 includes a bottom plate and two lower side plates located on both sides of the bottom plate respectively and disposed perpendicular to the bottom plate; the upper shell 201 may include a cover plate and two upper side plates located on both sides of the cover plate respectively and disposed perpendicular to the cover plate; and the two upper side plates are combined with the two lower side plates respectively, so that the upper shell 201 covers the lower shell 202.

A direction in which a connecting line between two openings 204 and 205 is located may be the same as a longitudinal direction of the optical module 200, or may not be the same as the longitudinal direction of the optical module 200. For example, the opening 204 is located at an end (a left end in FIG. 3) of the optical module 200, and the opening 205 is also located at an end (a right end in FIG. 3) of the optical module 200. Alternatively, the opening 204 is located at an end of the optical module 200, and the opening 205 is located on a side of the optical module 200. The opening 204 is an electrical port, a connecting finger of the circuit board 300 extends from the electrical port 204, and definitions for pins of the connecting finger form various industry protocols and specifications, and the connecting finger is configured to be inserted into the master monitor (e.g., the optical network terminal 100); and the opening 205 is an optical port, which is configured to access an external optical fiber 101, so that the external optical fiber 101 is connected to the silicon optical chip 403 inside the optical module 200.

By using an assembly mode of combining the upper shell 201 with the lower shell 202, it is possible to facilitate installation of components such as the circuit board 300 and the silicon optical chip 403 into the shell, and the upper shell 201 and the lower shell 202 may form encapsulation and protection for the components. In addition, when components such as the circuit board 300, the silicon optical chip 403 and the light source 500 are assembled, it is possible to facilitate arrangement of positioning parts, heat dissipation parts and electromagnetic shielding parts of these components, which is conducive to implementation of automated production.

In some embodiments, the upper shell 201 and the lower shell 202 are generally made of a metal material, which facilitates electromagnetic shielding and heat dissipation.

In some embodiments, the optical module 200 further includes an unlocking component 203 located on an outer wall of the shell thereof, and the unlocking component 203 is configured to implement or release a fixed connection between the optical module 200 and the master monitor (e.g., the optical network terminal 100).

For example, the unlocking component 203 is located on outer walls of the two lower side plates 2022 of the lower shell 202, and includes an engagement component that is matched with the cage of the master monitor (e.g., the cage 106 of the optical network terminal 100). When the optical module 200 is inserted into the cage of the master monitor, the optical module 200 is fixed in the cage of the master monitor by the engagement component of the unlocking component 203. On this basis, the unlocking component 203 is pulled, the engaging component of the unlocking component 203 moves with the pulling, and then a connection relationship between the engagement component and the master monitor is changed to release engagement between the optical module 200 and the master monitor, so that the optical module 200 may be drawn out of the cage of the master monitor.

The circuit board 300 includes a circuit wiring, electronic elements, chips, etc. Through the circuit wiring, the electronic elements and the chips are connected together according to a circuit design, so as to implement functions such as power supply, electrical signal transmission, and grounding. The electronic elements may be, for example, capacitors, resistors, triodes or metal-oxide-semiconductor field-effect transistors (MOSFETs). The chips may be, for example, microcontroller units (MCUs), clock and data recovery (CDR) chips, power management chips or digital signal processing (DSP) chips.

The circuit board 300 is generally a rigid circuit board, and the rigid circuit board may also implement a load-bearing function due to its relatively hard material. For example, the rigid circuit board may stably bear the electronic elements and the chips, and may also be inserted into the electrical connector in the cage of the master monitor.

The circuit board 300 further includes a connecting finger 301 formed on a surface of an end thereof. The connecting finger 301 is composed of a plurality of pins separate from each other, the circuit board 300 is inserted into the cage 106, and is conductively connected to the electrical connector in the cage 106 through the connecting finger 301. The connecting finger 301 may be disposed on only one surface (e.g., an upper surface shown in FIGS. 3 and 4) of the circuit board 300, or may be disposed on both upper and lower surfaces of the circuit board to adapt to an occasion with a demand for a large number of pins. The connecting finger 301 is configured to establish electrical connection with the master monitor, and the electrical connection may be used to implement power supply, grounding, an I2C signal transmission, a data signal transmission, etc.

Of course, flexible circuit boards are also used in some optical modules 200. As a supplement to the rigid circuit board, a flexible circuit board is generally used in conjunction with the rigid circuit board. For example, the light source 500 and the circuit board 300 may be connected by the flexible circuit board instead of the circuit wiring.

Figure 5:
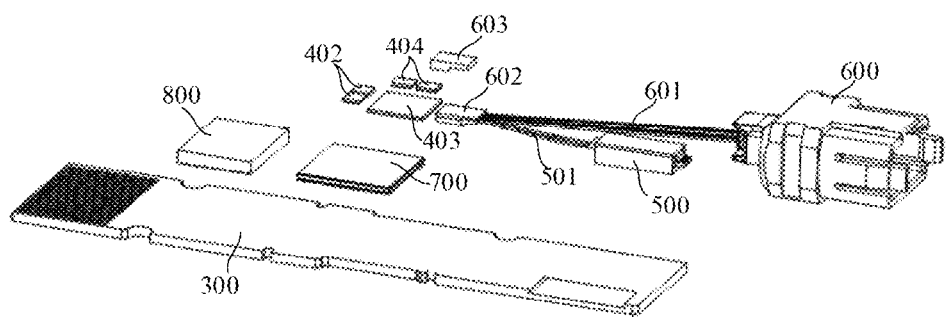
FIG. 5 is a schematic diagram showing structures a circuit board, a circuit adapter board, a silicon optical chip and an optical fiber socket that are in a disassembled state, in accordance with some embodiments.
Figure 6:
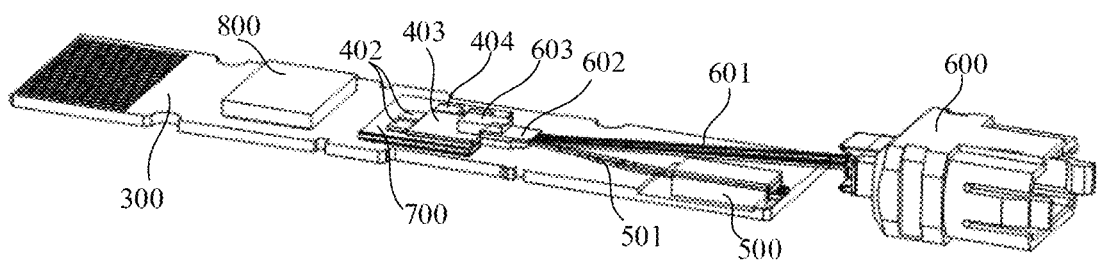
FIG. 6 is a schematic diagram showing an assembly structure of a circuit board, a circuit adapter board, a silicon optical chip and an optical fiber socket, in accordance with some embodiments.

In some embodiments, as shown in FIGS. 5 and 6, the optical module 200 further includes a first optical fiber ribbon 601, a second optical fiber ribbon 501 and an optical fiber socket 600. The silicon optical chip 403 is connected to one end of the first optical fiber ribbon 601, and the other end of the first optical fiber ribbon 601 is connected to the optical fiber socket 600. The silicon optical chip 403 is optically connected to the optical fiber socket 600 through the first optical fiber ribbon 601. The optical fiber socket 600 is configured to be connected to the optical fiber 101 outside the optical module 200, so as to realize optical connection between the silicon optical chip 403 and the optical fiber 101.

The silicon optical chip 403 is connected to one end of the second optical fiber ribbon 501, and the other end of the second optical fiber ribbon 501 is connected to the light source 500. The silicon optical chip 403 is optically connected to the light source 500 through the second optical fiber ribbon 501. The light source 500 supplies light that has constant power and does not carry information to the silicon optical chip 403 through the second optical fiber ribbon 501, the silicon optical chip 403 modulates the light to form an optical signal, which is transmitted to the optical fiber 101 through the first optical fiber ribbon 601 and the optical fiber socket 600; and an optical signal transmitted by the optical fiber 101 enters the silicon optical chip 403 through the optical fiber socket 600 and the first optical fiber ribbon 601; therefore, that the silicon optical chip 403 outputs an optical signal to the optical fiber 101 or receives an optical signal from the optical fiber 101 is realized.

The circuit adapter board 700 is located between the silicon optical chip 403 and the circuit board 300, and the silicon optical chip 403 is electrically connected to the circuit board 300 through the circuit adapter board 700.

In some embodiments, the circuit adapter board 700 includes two layers of sub-circuit adapter boards. A sub-circuit adapter board on a top layer is referred to as a top sub-circuit adapter board, and a sub-circuit adapter board on a bottom layer is referred to as a bottom sub-circuit adapter board. It will be understood that an upper surface of the circuit adapter board 700 is a surface of the top sub-circuit adapter board away from the bottom sub-circuit adapter board, and a lower surface of the circuit adapter board 700 is a surface of the bottom sub-circuit adapter board away from the top sub-circuit adapter board. The top sub-circuit adapter board is electrically connected to the silicon optical chip 403, and the bottom sub-circuit adapter board is electrically connected to the circuit board 300. The top sub-circuit adapter board and the bottom sub-circuit adapter board are electrically connected through internal wiring in the circuit adapter board 700, thereby achieving electrical connection between the silicon optical chip 403 and the circuit board 300.

In a case where the circuit adapter board 700 includes only one layer of sub-circuit adapter board, both a circuit electrically connected to the silicon optical chip 403 and a circuit electrically connected to the circuit board 300 need to be fabricated on the layer of sub-circuit adapter board, which causes that circuits on the layer of sub-circuit adapter board are complicated and difficult to fabricate. However, the solution in which the circuit adapter board 700 includes two layers of sub-circuit adapter boards can effectively solve this problem. Of course, in some embodiments, the circuit adapter board 700 may further includes more layers of sub-circuit adapter boards.

Figure 7A:
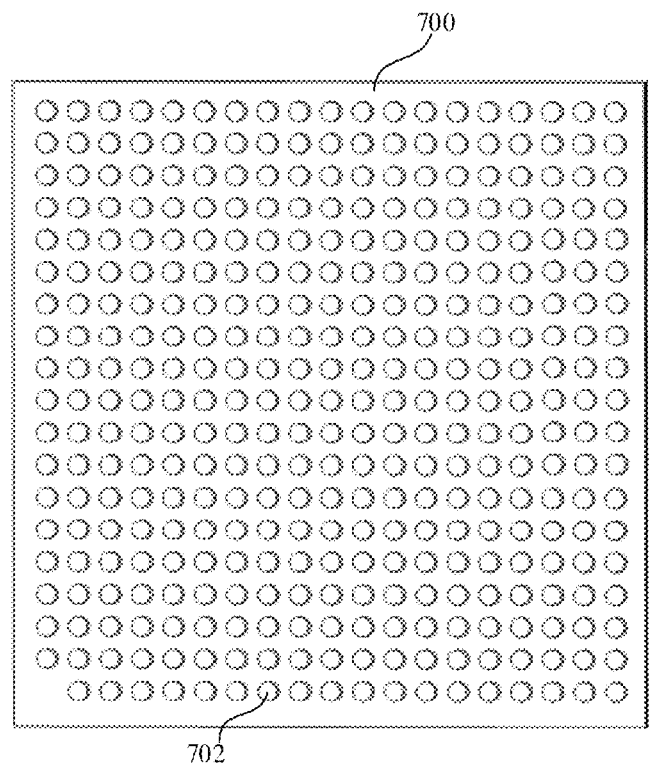
FIG. 7A is a schematic diagram showing a structure of a circuit adapter board, in accordance with some embodiments.
Figure 7B:
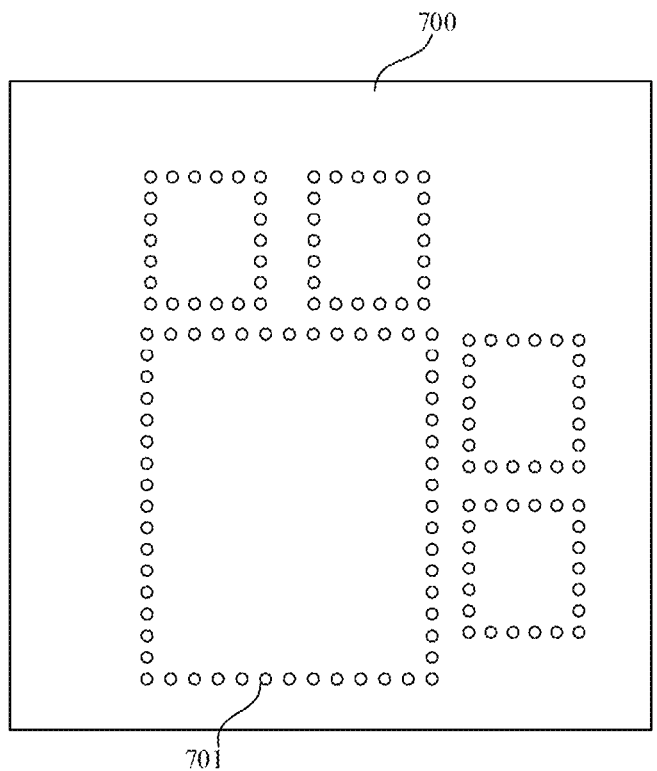
FIG. 7B is a schematic diagram showing another structure of a circuit adapter board, in accordance with some embodiments.

As shown in FIGS. 7A and 7B, the circuit adapter board 700 further includes first bonding pads 701 and second bonding pads 702. The first bonding pads 701 are disposed on the upper surface of the circuit adapter board 700 and are configured to be electrically connected to the silicon optical chip 403, so as to realize electrical connection between the circuit adapter board 700 and the silicon optical chip 403. The second bonding pads 702 are disposed on the lower surface of the circuit adapter board 700 and are configured to be electrically connected to the circuit board 300, so as to realize electrical connection between the circuit adapter board 700 and the circuit board 300. The first bonding pads 701 and the second bonding pads 702 are electrically connected through the internal wiring in the circuit adapter board 700 to realize the electrical connection between the silicon optical chip 403 and the circuit board 300, i.e., to realize a circuit switching function of the circuit adapter board 700.

In some embodiments of the present disclosure, the first bonding pads 701 and the second bonding pads 702 are respectively disposed on the upper surface and the lower surface of the circuit adapter board 700, i.e., on two different surfaces of the circuit adapter board 700. In this way, the wiring difficulty of the internal wiring in the circuit adapter board 700 for connecting the first bonding pads 701 and the second bonding pads 702 may be reduced.

It will be noted that, as shown in FIG. 7A, the second bonding pads 702 may be designed in a form of ball grid array (BGA). Of course, in some embodiments, the second bonding pads 702 may be designed as wire bonding pads distributed on an edge of the circuit adapter board 700. In this case, the circuit board 300 includes wire bonding pads corresponding thereto, and the electrical connection between the circuit adapter board 700 and the circuit board 300 is realized by wire bonding.

During the use of the optical module 200, the silicon optical chip 403 may generate a large amount of heat. In particular, for the optical module 200 performing high-speed signal transmission (e.g., at a signal transmission rate of 100 Gb/s, 400 Gb/s or 1040 Gb/s), the silicon optical chip 403 thereof generates more heat. When the silicon optical chip 403 is directly carried on the circuit board 300, the heat generated by the silicon optical chip 403 will be directly conducted to the circuit board 300. Based on material characteristics of the circuit board 300 itself, the circuit board 300 may be greatly deformed after being heated. As a result, a position of the silicon optical chip 403 is changed relative to the first optical fiber ribbon 601 and the second optical fiber ribbon 501, which affects optical coupling efficiencies between the silicon optical chip 403 and the first optical fiber ribbon 601 and between the silicon optical chip 403 and the second optical fiber ribbon 501.

In some embodiments, a thermal expansion coefficient of the circuit adapter board 700 is lower than that of the circuit board 300. The silicon optical chip 403 may be disposed on the circuit adapter board 700.

The thermal expansion coefficient of the circuit adapter board 700 is lower than that of the circuit board 300, and a thermal deformation of the circuit adapter board 700 is smaller than that of the circuit board 300, that is, a thermal stability of the circuit adapter board 700 is better than that of the circuit board 300. Therefore, during the operation of the optical module 200, the circuit adapter board 700 may provide a more stable bearing surface for the silicon optical chip 403 disposed thereon, so as to ensure stability of relative positions between the silicon optical chip 403 and the first optical fiber ribbon 601 and between the silicon optical chip 403 and the second optical fiber ribbon 501, and to further ensure stability of the optical coupling efficiencies between the silicon optical chip 403 and the first optical fiber ribbon 601 and between the silicon optical chip 403 and the second optical fiber ribbon 501. In addition, the circuit adapter board 700 further has a circuit switching function, so as to realize the electrical connection between the silicon optical chip 403 and the circuit board 300, and to in turn realize that the silicon optical chip 403 converts an electrical signal from the circuit board 300 into an optical signal and then outputs the optical signal to the optical fiber 101, or converts an optical signal from the optical fiber 101 into an electrical signal and then outputs the electrical signal to the circuit board 300.

On the basis of ensuring that the thermal expansion coefficient of the circuit adapter board 700 is lower than that of the circuit board 300, in some embodiments, the circuit adapter board 700 is made of materials suitable for high-precision processing, such as ceramics, aluminum nitride and aluminum oxide, so that a surface flatness of the circuit adapter board 700 is higher than that of the circuit board 300. In this way, compared with the circuit board 300, the circuit adapter board 700 may provide a flatter bearing surface for the silicon optical chip 300, thereby promoting alignment accuracies between the silicon optical chip 300 and the first optical fiber ribbon 601 and between the silicon optical chip 300 and the second optical fiber ribbon 501, so as to improve the optical coupling efficiencies between the silicon optical chip 300 and the first optical fiber ribbon 601 and between the silicon optical chip 300 and the second optical fiber ribbon 501.

As will be seen from the above description, the silicon optical chip 403 generates a large amount of heat during a photoelectric conversion process when the optical module 200 is applied to a high-speed signal transmission scene. Semiconductor devices such as the silicon optical chip 403 are very sensitive to heat, and if heat is not conducted out in time, the performance of the silicon optical chip 403 may be significantly affected. Therefore, in some embodiments, the circuit adapter board 700 is made of a material with a better heat dissipation performance, i.e., a material with a thermal conductivity greater than that of the circuit board 300, such as ceramics, aluminum nitride and aluminum oxide. In this way, the heat generated by the silicon optical chip 403 may be absorbed by the circuit adapter board 700 and diffused outwards through the circuit adapter board 700, thereby effectively preventing the heat from accumulating in the silicon optical chip 403.

Figure 8:
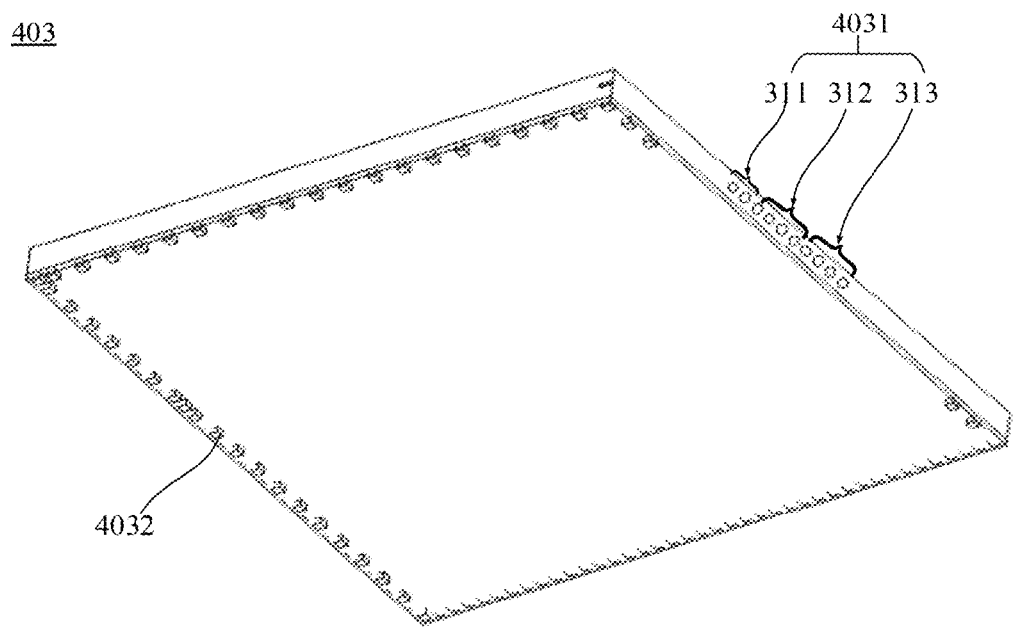
FIG. 8 is a schematic diagram showing a structure of a silicon optical chip, in accordance with some embodiments.

FIG. 8 is a schematic diagram showing a structure of a silicon optical chip in accordance with some embodiments. As shown in FIG. 8, the silicon optical chip 403 includes third bonding pads 4032. The third bonding pads 4032 are disposed on a surface of the silicon optical chip 403 proximate to the circuit adapter board 700, i.e., a lower surface of the silicon optical chip 403, and may be designed in a form of BGA. The third bonding pads 4032 may be soldered on corresponding first pads 701 on the circuit adapter board 700 by solder to electrically connect the silicon optical chip 403 and the circuit adapter board 700, thereby achieving signal transmission between the circuit adapter board 700 and the silicon optical chip 403. The solder may be gold-tin solder or copper-tin solder.

Of course, the third bonding pads 4032 may also be disposed on a surface of the silicon optical chip 403 away from the circuit adapter board 700, i.e., an upper surface of the silicon optical chip 403. Then, the third bonding pads 4032 are electrically connected to the corresponding first bonding pads 701 on the circuit adapter board 700 by wire bonding. Connecting wires used for wire bonding may be gold wires or other materials. Compared with the method of direct welding by solder, the connecting wires used in the method of wire bonding is more susceptible to damage. In addition, a ball welding is generally used during wire bonding, and thus the connecting wires used for wire bonding raised higher relative to the upper surface of the silicon optical chip 403, which may increase an overall thickness of the optical module 200. In addition, compared with the method of direct soldering by solder, the method of wire bonding will extend a signal propagation path, and a diameter of the connecting wires used for wire bonding is generally small, and thus parasitic inductance introduced by the connecting wires may be relatively large. Moreover, as a communication rate of the optical module 200 increases, the parasitic inductance introduced by connecting wires is also increasing, and in turn an impact of the parasitic inductance on the high-speed optoelectronic performance of the optical module 200 is also greater.

FIG. 5 is a schematic diagram showing structures of a circuit board, a circuit adapter board, a silicon optical chip and an optical fiber socket that are in a disassembled state in accordance with some embodiments, and FIG. 6 is a schematic diagram showing an assembly structure of a circuit board, a circuit adapter board, a silicon optical chip and an optical fiber socket in accordance with some embodiments. As shown in FIGS. 5 and 6, in addition to the silicon optical chip 403, the optical module 200 further includes a driver chip 402 and a trans-impedance amplifier 404 that are disposed on the circuit adapter board 700. The driver chip 402 and the trans-impedance amplifier 404 are electrically connected to the circuit adapter board 700 to realize electrical connection between the driver chip 402 and the circuit board 300 and between the trans-impedance amplifier 404 and the circuit board 300.

The driver chip 402 is disposed on a side of the silicon optical chip 403 and is configured to supply a modulation signal to the silicon optical chip 403. The trans-impedance amplifier 404 is disposed on another side of the silicon optical chip 403 and is configured to convert a current signal output by the silicon optical chip 403 into a voltage signal. A process of the optical module 200 for implementing interconversion between an optical signal and an electrical signal is as follows. The silicon optical chip 403 receives light emitted by the light source 500, modulates the light based on a modulation signal sent by the driver chip 402 to generate an optical signal, and the optical signal is transmitted to the optical fiber socket 600 through the first optical fiber ribbon 601, and then is transmitted to the remote server 1000 through the optical fiber 101; the silicon optical chip 403 receives an optical signal from the outside of the optical fiber socket 600 and then converts the optical signal into a current signal to be output to the trans-impedance amplifier 404, and the trans-impedance amplifier 404 converts the current signal into a voltage signal; and then a DSP chip on the circuit board 300 further processes the voltage signal to extract data in the optical signal, and the connecting finger 301 transmits the data to the local information processing device 2000.

In some embodiments of the present disclosure, the driver chip 402 and the trans-impedance amplifier 404 are disposed on the circuit adapter board 700. Compared with a manner in which the driver chip 402 and/or the trans-impedance amplifier 404 are disposed on the upper surface of the silicon optical chip 403 (that is, the driver chip 402 and/or the trans-impedance amplifier 404 are integrated with the silicon optical chip 403) to form an integrated chip, the above arrangement manner not only may reduce an overall thickness of the optical module 200, but also may reduce an integration level of the integrated chip to avoid a problem that the entire integrated chip needs to be scrapped after one of the silicon optical chip 403, the driver chip 402 and the trans-impedance amplifier 404 is damaged, which is beneficial to reducing the production cost.

The driver chip 402 includes fourth bonding pads, and the fourth bonding pads are disposed on a surface of the driver chip 402 proximate to the circuit adapter board 700, i.e., a lower surface of the driver chip 402. The fourth bonding pads are soldered to corresponding first bonding pads 701 on the circuit adapter board 700 by solder, so as to achieve electrical connection between the driver chip 402 and the circuit adapter board 700, and to further achieve electrical connection between the driver chip 402 and the circuit board 300. Of course, the fourth bonding pads may also be disposed on a surface of the driver chip 402 away from the circuit adapter board 700, i.e., an upper surface of the driver chip 402. The fourth bonding pads are connected to the corresponding first bonding pads 701 on the circuit adapter board 700 by wire bonding.

The trans-impedance amplifier 404 includes fifth bonding pads, and the fifth bonding pads are disposed on a surface of the trans-impedance amplifier 404 proximate to the circuit adapter board 700, i.e., a lower surface of the trans-impedance amplifier 404. The fifth bonding pads are soldered to corresponding first bonding pads 701 on the circuit adapter board 700 by solder, so as to achieve electrical connection between the trans-impedance amplifier 404 and the circuit adapter board 700, and to further achieve electrical connection between the trans-impedance amplifier 404 and the circuit board 300. Of course, the fifth bonding pads may also be disposed on a surface of the trans-impedance amplifier 404 away from the circuit adapter board 700, i.e., an upper surface of the trans-impedance amplifier 404. The fifth bonding pads are connected to the corresponding first bonding pads 701 on the circuit adapter board 700 by wire bonding.

It will be noted that connection modes of the driver chip 402 and the trans-impedance amplifier 404 to the circuit adapter board 700 may be the same or different. For example, the fourth bonding pads of the driver chip 402 may be disposed on the lower surface of the driver chip 402 and connected to the circuit adapter board 700 by solder, and the fifth bonding pads of the trans-impedance amplifier 404 may be disposed on the upper surface of the trans-impedance amplifier 404 and connected to the circuit adapter board 700 by wire bonding.

The driver chip 402 needs to supply a modulation signal to the silicon optical chip 403, and the silicon optical chip 403 needs to send a generated current signal to the trans-impedance amplifier 404 to be converted into a voltage signal. Therefore, the driver chip 402 and the trans-impedance amplifier 404 need to be electrically connected to the silicon optical chip 403, respectively.

In some embodiments of the present disclosure, the driver chip 402 and the trans-impedance amplifier 404 are electrically connected to the silicon optical chip 403 through the internal wiring in the circuit adapter board 700, respectively. For example, after the driver chip 402 and the trans-impedance amplifier 403 are electrically connected to the circuit adapter board 700 through the fourth bonding pads and the fifth bonding pads, respectively, they are electrically connected to the circuit board 300 through the second bonding pads on the circuit adapter board 700, and they are electrically connected to the silicon optical chip 403 through the internal wiring in the circuit adapter board 700. In this way, signal transmission between the driver chip 402 and the silicon optical chip 403 and between the trans-impedance amplifier 404 and the silicon optical chip 403 may be performed through the corresponding internal wiring in the circuit adapter board 700. For example, the modulated signal output by the driver chip 402 is first transmitted to the circuit adapter board 700, and then transmitted to the silicon optical chip 403 through the internal wiring in the circuit adapter board 700. The current signal output by the silicon optical chip 403 is first transmitted to the circuit adapter board 700, and then transmitted to the trans-impedance amplifier 404 through the internal wiring in the circuit adapter board 700.

In a case where the circuit adapter board 700 includes two or more layers of sub-circuit adapter boards, the internal wiring may be located on surface(s) of one or some sub-circuit adapter boards, and after this or these sub-circuit adapter boards are combined with other sub-circuit adapter boards to form the circuit adapter board 700, the internal wiring is located inside the circuit adapter board 700, thereby protecting the internal wiring from being damaged.

Of course, in some embodiments, bonding pads may also be provided on upper surfaces of the driver chip 402, the trans-impedance amplifier 404 and the silicon optical chip 403, and the driver chip 402 and the trans-impedance amplifier 404 are directly connected to the silicon optical chip 403 by wire bonding. It will be noted that the connection modes of the driver chip 402 and the trans-impedance amplifier 404 to the silicon optical chip 403 are not limited to the same mode. For example, the driver chip 402 is first electrically connected to the circuit adapter board 700, and then electrically connected to the silicon optical chip 403 through the internal wiring in the circuit adapter board 700; while the trans-impedance amplifier is directly electrically connected to the silicon optical chip 403 by wire bonding.

In some embodiments of the present disclosure, as shown in FIG. 8, the silicon optical chip 403 includes optical waveguide end facets 4031 disposed on a side thereof, and the optical waveguide end facets 4031 may be divided into a first light inlet waveguide end facet 311, a second light inlet waveguide end facet 312 and a light outlet waveguide end facet 313 according to different light entering and exiting directions. FIG. 8 exemplarily shows two first light inlet waveguide end facets 311, four second light inlet waveguide end facets 312 and four light outlet waveguide end facets 313.

The second light inlet waveguide end facet 312 and the light outlet waveguide end facet 313 are configured to be butted to one end of the first optical fiber ribbon 601, and the other end of the first optical fiber ribbon 601 is connected to the optical fiber socket 600. The silicon optical chip 403 is optically connected to the optical fiber socket 600 through the first optical fiber ribbon 601, so that the silicon optical chip 403 is optically connected to the optical fiber 101 outside the optical module 200. An optical signal modulated by the silicon optical chip 403 is transmitted to the first optical fiber ribbon 601 through the light outlet waveguide end facet 313, is then transmitted to the optical fiber socket 600 through the first optical fiber ribbon 601, and is finally transmitted to the external optical fiber 101 through the optical fiber socket 600. An optical signal transmitted from the external optical fiber 101 is transmitted to the first optical fiber ribbon 601 through the optical fiber socket 600, is then transmitted to the second light inlet waveguide end facet 312 through the first optical fiber ribbon 601, and is finally transmitted to the silicon optical chip 403 through the second light inlet waveguide end facet 312. Thus, the silicon optical chip 403 outputs light carrying data to the optical fiber 101 outside the optical module 200, or receives light carrying data from the optical fiber 101 outside the optical module 200.

The first light inlet waveguide end facet 311 is configured to be butted to one end of the second optical fiber ribbon 501, the other end of the second optical fiber ribbon 501 is connected to the light source 500, and the silicon optical chip 403 is optically connected to the light source 500 through the second optical fiber ribbon 501. The light source 500 supplies light without carrying information to the silicon optical chip 403. The light without carrying information is transmitted to the first light inlet waveguide end facet 311 through the second optical fiber ribbon 501, and enters the silicon optical chip 403 through the first light inlet waveguide end facet 311. Then, the silicon optical chip 403 modulates the received light without carrying information based on the modulation signal output by the driver chip 402 to form an optical signal, which is transmitted to the light outlet waveguide end facet 313 through an optical waveguide inside the silicon optical chip 403, and is finally transmitted to the optical fiber socket 600 through the first optical fiber ribbon 601, so as to be transmitted to the outside of the optical module 200.

Based on the above structure, an optical module with a signal transmission rate of 400 Gb/s is taken as an example to describe a working process of the optical module. In the optical module with a signal transmission rate of 400 Gb/s, an electrical signal transmission rate is a product of 8 and 50 Gb/s (8×50 Gb/s), i.e., 8 electrical signal transmission channels with a transmission rate of 50 Gb/s; an optical signal rate is a product of 4 and 100 Gb/s (4×100 Gb/s), i.e., 4 optical signal transmission channels with a transmission rate of 100 Gb/s.

Figure 9:
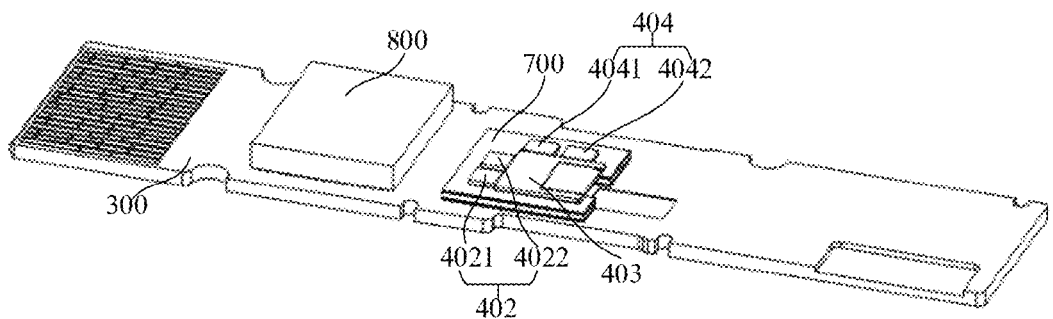
FIG. 9 is a schematic diagram showing a partial structure of an optical module, in accordance with some embodiments.

FIG. 9 is a schematic diagram showing a partial structure of an optical module in accordance with some embodiments. As shown in FIG. 9, the driver chip 402 and the trans-impedance amplifier 404 are both 2-channel chips, and the silicon optical chip 403 is a 4-channel chip. That is, the optical module 200 includes two driver chips 402 and two trans-impedance amplifiers 404. The two driver chips 402 are a first driver chip 4021 and a second driver chip 4022, respectively; and the two trans-impedance amplifiers 404 are a first trans-impedance amplifier 4041 and a second trans-impedance amplifier 4042, respectively. A side of the silicon optical chip 403 provided with the optical waveguide end facets 4031 are disposed near an edge of the circuit adapter board 700 proximate to the optical port 205, so as to facilitate butting of the optical waveguide end facets 4031 to the first optical fiber ribbon 601 and the second optical fiber ribbon 501. The first driver chip 4021 and the second driver chip 4022 are located on a side of the silicon optical chip 403, and the first trans-impedance amplifier 4041 and the second trans-impedance amplifier 4042 are located on another side of the silicon optical chip 403.

A process in which the silicon optical chip 403 sends an optical signal to the outside is as follows. Eight channels of high-frequency differential signals are input at a rate of 50 Gb/s through the connecting finger 301 on the circuit board 300, and after the high-frequency differential signals are processed by a CDR chip 800, four channels of high-frequency differential signals are output at a rate of 100 Gb/s. Then, the four channels of high-frequency differential signals are transmitted to the circuit adapter board 700 through the circuit wiring on the circuit board 300, and the four channels of high-frequency differential signals are transmitted to the first driver chip 4021 and the second driver chip 4022 through the internal wiring in the circuit adapter board 700. The first driver chip 4021 and the second driver chip 4022 adjust an amplitude and the like of the four channels of high-frequency differential signals with the transmission rate of 100 Gb/s, and then output them to the silicon optical chip 403. The high-frequency differential signals output by the first driver chip 4021 and the second driver chip 4022 may be transmitted to the silicon optical chip 403 through the circuit adapter board 700, or may be directly transmitted to the silicon optical chip 403.

The silicon optical chip 403 has a light modulation unit. The silicon optical chip 403 receives light with constant power output by the light source 500 through the first light inlet waveguide end facet 311, and transmits the light to the light modulation unit through the optical waveguide having the first light inlet waveguide end facet 311 inside the silicon optical chip 403. Then, the optical modulation unit modulates the received light with constant power based on the above high-frequency differential signals with the transmission rate of 100 Gb/s to form an optical signal, and transmits the optical signal to the light outlet waveguide end facet 313 through the optical waveguide inside the silicon optical chip 403. A common optical modulation unit is a Mach-Zehnder interferometer. In addition, the CDR chip 800 may be replaced with a DSP chip.

A process in which the silicon optical chip 403 receives external optical signals is as follows. Four channels of optical signals with a transmission rate of 100 Gb/s are input through the optical fiber socket 600, and the optical signals are transmitted to the silicon optical chip 403 after sequentially passing through the first optical fiber ribbon 601 and the second light inlet waveguide end facet 312. After a photo-diode (PD) inside the silicon optical chip 403 converts the optical signals into a current signal, the silicon optical chip 403 sends the current signal to the first trans-impedance amplifier 4041 and the second trans-impedance amplifier 4042. The current signal output by the silicon optical chip 403 may be transmitted to the first trans-impedance amplifier 4041 and the second trans-impedance amplifier 4042 through the circuit adapter board 700, or may be directly transmitted to the first trans-impedance amplifier 4041 and the second trans-impedance amplifier 4042.

The first trans-impedance amplifier 4041 and the second trans-impedance amplifier 4042 convert the current signal into a voltage signal, and send the voltage signal to the circuit board 300 through the circuit adapter board 700 in a form of four channels of high-frequency differential signals with a transmission rate of 100 Gb/s. Then, the voltage signal is sent to the CDR chip 800 through the circuit wiring on the circuit board 300. After the voltage signal is processed by the CDR chip 800, eight channels of high-frequency differential signals with a transmission rate of 50 Gb/s are output to the connecting finger 301 on the circuit board 300.

It will be noted that the layout of the driver chip 402, the trans-impedance amplifier 404 and the silicon optical chip 403 may also be designed in other layouts as required. For example, two trans-impedance amplifiers and two driver chips are both disposed on the same side of the silicon optical chip 403; in addition, the trans-impedance amplifier and the driver chip each may also be designed as a four-channel chip, or the trans-impedance amplifier and the driver chip may also be integrated in a same chip. In this regard, some embodiments of the present disclosure are not limited thereto.

Regardless of the above layout of the driver chip 402, the trans-impedance amplifier 404 and the silicon optical chip 403, in some embodiments of the present disclosure, the side of the silicon optical chip 403 provided with the optical waveguide end facets 4031 are disposed near the edge of the circuit adapter board 700 proximate to the optical port 205, so as to facilitate butting of the optical waveguide end facets 4031 to the first optical fiber ribbon 601 and the second optical fiber ribbon 501.

In an assembly process of the optical module 200, the silicon optical chip 403 is generally fixed on the circuit adapter board 700 by glue, and is electrically connected to the circuit adapter board 700 by welding the third bonding pads 4032 and corresponding first bonding pads 701 on the circuit adapter board 700. Since the glue has certain fluidity, the glue is likely to flow to an outer periphery of the silicon optical chip 403 when the silicon optical chip 403 is fixed by glue. While the optical waveguide end facets 4031 are disposed on a side of the silicon optical chip 403, and thus the glue flowing to the outer periphery of the silicon optical chip 403 is apt to contaminate the optical waveguide end facets 4031. To solve this problem, some embodiments of the present disclosure improve the circuit adapter board 700 to prevent the glue from easily flowing onto the optical waveguide end facets 4031 of the silicon optical chip 403.

Figure 10:
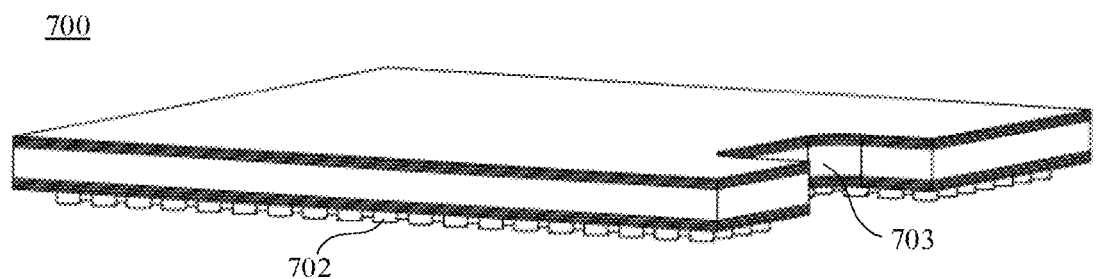
FIG. 10 is a schematic diagram showing a structure of another circuit adapter board, in accordance with some embodiments.
Figure 11:
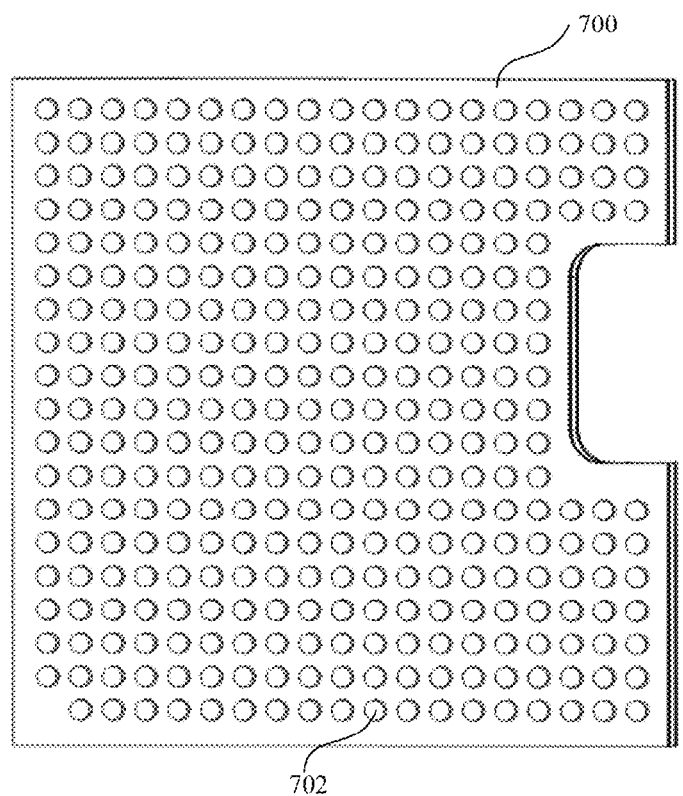
FIG. 11 is a plan view of the circuit adapter board shown in FIG. 10.

FIG. 10 is a schematic diagram showing a structure of another circuit adapter board in accordance with some embodiments, and FIG. 11 is a plan view of the circuit adapter board shown in FIG. 10. As shown in FIGS. 10 and 11, the circuit adapter board 700 further includes a notch 703, and the notch 703 is located on a side of the circuit adapter board 700 proximate to the optical waveguide end facets 4031 of the silicon optical chip 403. A shape of the notch 703 may be U-shaped, square, etc. In order to facilitate flow of the glue into the notch 703, corners of the notch 703 are designed as arc-shaped corners in some embodiments of the present disclosure.

Figure 12:
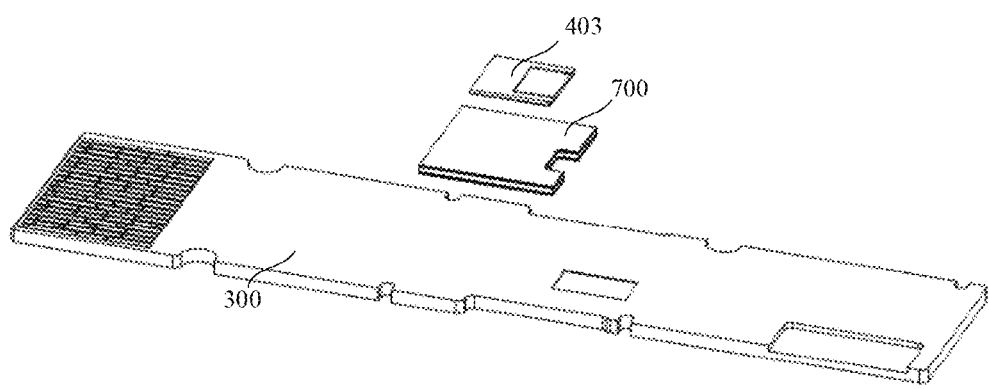
FIG. 12 is a schematic diagram showing structures of a circuit board, a circuit adapter board and a silicon optical chip that are in a disassembled state, in accordance with some embodiments.
Figure 13:
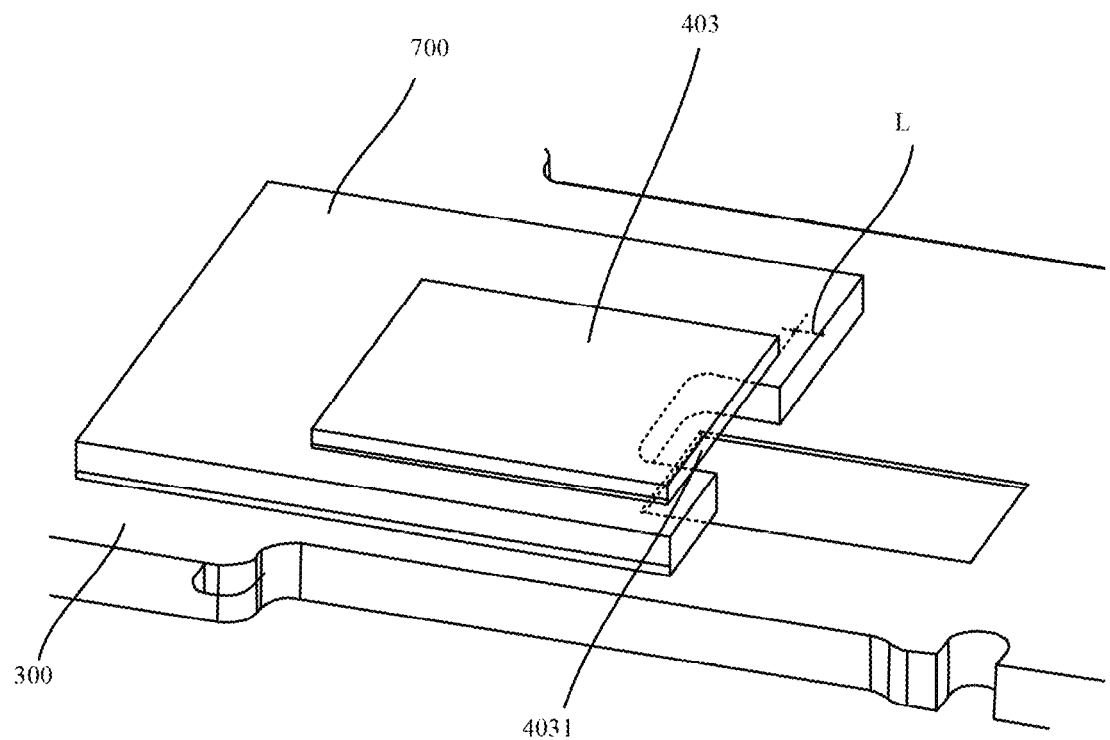
FIG. 13 is a schematic diagram showing a partial structure of an assembly structure of a circuit board, a circuit adapter board and a silicon optical chip, in accordance with some embodiments.

FIG. 12 is a schematic diagram showing structures of a circuit board, a circuit adapter board and a silicon optical chip that are in a disassembled state in accordance with some embodiments, and FIG. 13 is a schematic diagram of an assembly structure of a circuit board, a circuit adapter board and a silicon optical chip in accordance with some embodiments. As shown in FIGS. 12 and 13, the circuit adapter board 700 is soldered on the circuit board 300, the silicon optical chip 403 is soldered on the circuit adapter board 700, and the silicon optical chip 403 and the circuit adapter board 700 are fixed by glue. As shown in FIG. 13, the silicon optical chip 403 is bridged over the notch 703 of the circuit adapter board 700, and the optical waveguide end facet 4031 thereof is located over the notch 703. In this way, when a bottom surface of the silicon optical chip 403 is fixed on the circuit adapter board 700 by glue, the glue overflowing from a position of the silicon optical chip 403 proximate to the optical waveguide end facets 4031 to the outer periphery of the silicon optical chip 403 may flow to the notch 703, thereby avoiding the problem that the optical waveguide end facets 4031 are contaminated by glue.

In some embodiments of the present disclosure, as shown in FIG. 13, there is a distance L between a side of the silicon optical chip 403 provided with the optical waveguide end facets 4031 and a side of the circuit adapter board 700 provided with the notch 703. Moreover, the side of the circuit adapter board 700 provided with the notch 703 is closer to the optical port 205 than the side of the silicon optical chip 403 provided with the optical waveguide end surfacets 4031. One end of the first optical fiber ribbon 601 and one end of the second optical fiber ribbon 501 extend into the notch 703 to realize optical connection between the silicon optical chip 403 and the first optical fiber ribbon 601 and between the silicon optical chip 403 and the second optical fiber ribbon 501. Such an arrangement not only may have a certain guiding effect on arrangement positions of the ends of the first optical fiber ribbon 601 and the second optical fiber ribbon 501, which are used for being connected to the silicon optical chip 403, but also may enlarge the heat dissipation area of the circuit adapter board 700 dissipating the silicon optical chip 403.

Of course, the side of the silicon optical chip 403 provided with the optical waveguide end facets 4031 may also be flush with the side of the circuit adapter board 700 provided with the notch 703, or the side of the silicon optical chip 403 provided with the optical waveguide end facets 4031 protrudes from the side of the circuit adapter board 700 provided with the notch 703.

Diameters of the optical waveguide end facets 4031 in the silicon optical chip 403 and the optical fibers in the first optical fiber ribbon 601 and the second optical fiber ribbon 501 are very small, generally approximately 9 μm. Therefore, in order to ensure the coupling efficiency between the optical waveguide end facets 4031 and the first optical fiber ribbon 601 and the coupling efficiency between the optical waveguide end facets 4031 and the second optical fiber ribbon 501, stability of relative positions between the optical waveguide end facets 4031 and the optical fibers in the first optical fiber ribbon 601 and also the second optical fiber ribbon 501 is very important.

In order to ensure stability of relative positions between the first optical fiber ribbon 601 and the silicon optical chip 403 and between the second optical fiber ribbon 501 and the silicon optical chip 403, so as to ensure the coupling efficiencies between the silicon optical chip 403 and the first optical fiber ribbon 601 and between the silicon optical chip 403 and the second optical fiber ribbon 501, in some embodiments, the optical module 200 further includes a first optical fiber ribbon connector 602. The first optical fiber ribbon connector 602 is disposed on the circuit board 300 and is configured to clamp the ends of the first optical fiber ribbon 601 and the second optical fiber ribbon 501, which are used for being butting to the silicon optical chip 403.

Figure 14:
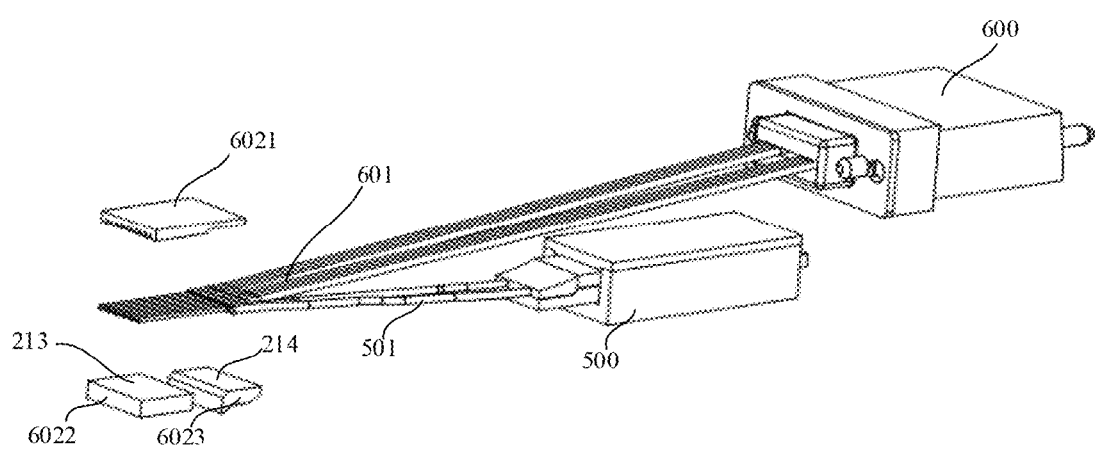
FIG. 14 is a schematic diagram showing a disassembled structure of a first optical fiber ribbon connector, in accordance with some embodiments.
Figure 15:
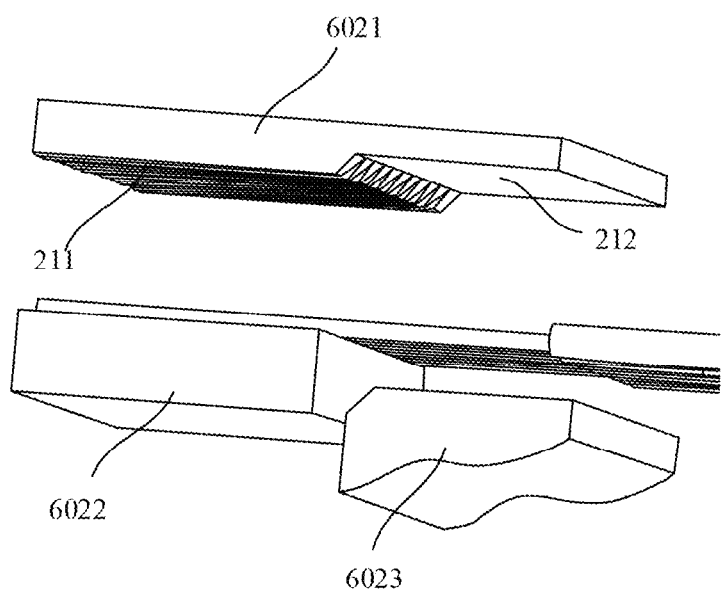
FIG. 15 is a schematic diagram showing another disassembled structure of a first optical fiber ribbon connector, in accordance with some embodiments.

FIG. 14 is a schematic diagram showing a disassembled structure of a first optical fiber ribbon connector in accordance with some embodiments, and FIG. 15 is a schematic diagram showing another disassembled structure of a first optical fiber ribbon connector in accordance with some embodiments. As shown in FIGS. 14 and 15, the first optical fiber ribbon connector 602 includes a first fixing component 6021, a second fixing component 6022 and a third fixing component 6023.

The first fixing component 6021 includes a first clamping surface 211 and a second clamping surface 212 for clamping optical fibers, i.e., two surfaces in contact with the optical fibers in the first optical fiber ribbon 601 and the second optical fiber ribbon 501. The first clamping surface 211 and the second clamping surface 212 form a stepped structure. The first clamping surface 211 is provided with a plurality of grooves for fixing the optical fibers. An arrangement density of the plurality of grooves may be set according to an arrangement density of the optical waveguide end facets 4031 in the silicon optical chip 403. The second clamping surface 212 is set to a flat surface. Of course, a plurality of grooves may also be provided on the second clamping surface 212.

The second fixing component 6022 includes a third clamping surface 213 for clamping the optical fibers, and the third fixing component 6023 includes a fourth clamping surface 214 for clamping the optical fibers. The third clamping surface 213 cooperates with the first clamping surface 211 to fix optical fiber segments without a protective layer in the first optical fiber ribbon 601 and the second optical fiber ribbon 501 in the plurality of grooves provided on the first clamping surface 211. The fourth clamping surface 214 cooperates with the second clamping surface 212 to clamp optical fiber segments with the protective layer in the first optical fiber ribbon 601 and the second optical fiber ribbon 501.

The optical fibers in the first optical fiber ribbon 601 and the second optical fiber ribbon 501 include a core, a cladding close to the core, and a protective layer outside the cladding. A refractive index of the core is greater than that of the cladding, so that light is totally reflected in the core and then propagates in the core. When the first optical fiber ribbon 601 and the second optical fiber ribbon 501 are installed, protective layers at ends of the optical fibers in the first optical fiber ribbon 601 and the second optical fiber ribbon 501 are removed to expose the claddings covering the cores, and the optical fibers with the protective layers removed are placed in corresponding grooves. The protective layer of the optical fiber is thick, and the optical fiber with the protective layer is not conducive to being accurately fixed in a corresponding groove, and thus a design of removing the protective layer is used.

Figure 16:
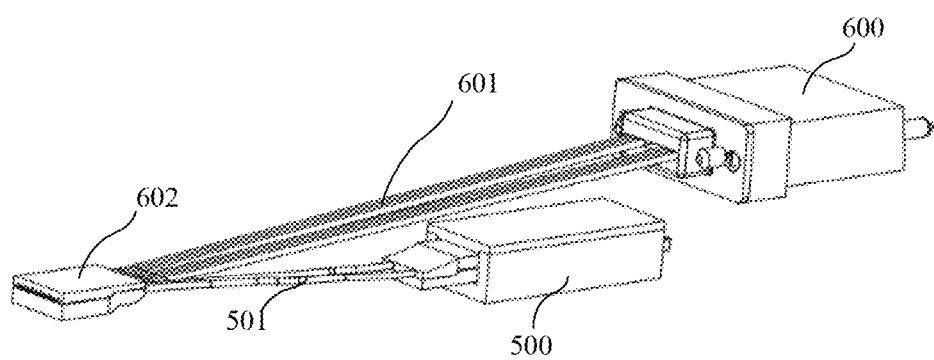
FIG. 16 is a schematic diagram of an assembly structure of a light source, an optical fiber socket and a first optical fiber ribbon connector, in accordance with some embodiments.
Figure 17:
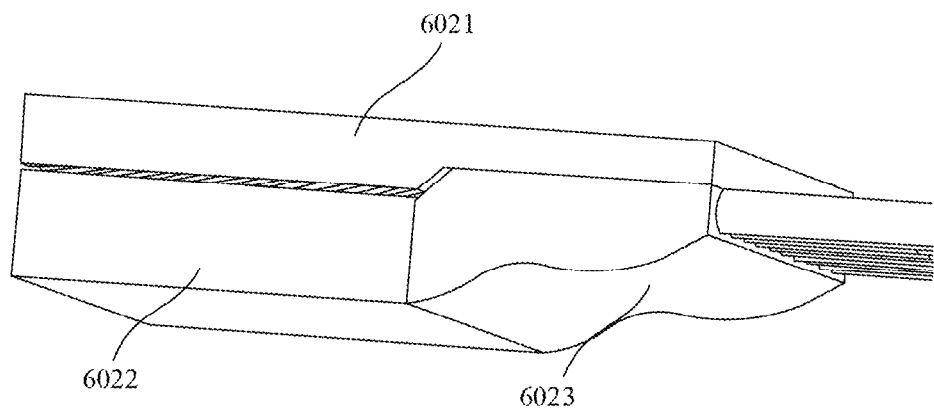
FIG. 17 is a schematic diagram of an assembly structure of a first optical fiber ribbon connector, in accordance with some embodiments.

FIG. 16 is a schematic diagram showing an assembly structure of a light source, an optical fiber socket and a first optical fiber ribbon connector in accordance with some embodiments, and FIG. 17 is a schematic diagram showing an assembly structure of the first optical fiber ribbon connector in accordance with some embodiments. As shown in FIGS. 16 and 17, the first fixing component 6021 and the second fixing component 6022 as well as the first fixing component 6021 and the third fixing part 6023 may be fixed by glue. The plurality of grooves enable the optical fibers in the first optical fiber ribbon 601 and the second optical fiber ribbon 501 to be separated into individual optical fibers with a fixed relative position, so as that the individual optical fibers are aligned with the optical waveguide end facets 4031 in the silicon optical chip 403. In addition, the fourth clamping surface 214 of the third fixing component 6023 cooperates with the second clamping surface 212 of the first fixing component 6021 to fix the optical fibers, so as to further ensure firmness of fixing the optical fibers in a light propagation direction.

Of course, the first optical fiber ribbon connector 602 may also be configured in other structural forms. For example, the first optical fiber ribbon connector 602 is designed to be composed of upper and lower portions. The above design of the first optical fiber ribbon connector 602 in some embodiments of the present disclosure not only may separate the optical fibers in the first optical fiber ribbon 601 and the second optical fiber ribbon 501 by a corresponding distance according to a distance between adjacent optical waveguide end facets in the silicon optical chip 403, but also may ensure the firmness of fixing the optical fibers. In addition, the first optical fiber ribbon connector 602 in the above design includes three separate structures, i.e., the first fixing component 6021, the second fixing component 6022 and the third fixing component 6023, which may facilitate the installation of the fixing components.

A surface flatness of the circuit board 300 is poor and a processing accuracy thereof is in a millimeter level, while an alignment accuracy of the optical waveguide end facets 4031 in the silicon optical chip 403 and the optical fibers is in a micron level. In addition, due to a fact that a material of the circuit board 300 itself is deformed severely after being heated, a position of the first optical fiber ribbon connector 602 disposed on the circuit board 300 relative to the silicon optical chip 403 changes after the circuit board 300 is heated. In order to ensure the alignment accuracy of the optical waveguide end facets 4031 in the silicon optical chip 403 and the optical fibers in the first optical fiber ribbon connector 602, the optical module 200 further includes a connector fixing component 603. The connector fixing component 603 is configured to fix the silicon optical chip 403 and the first optical fiber ribbon connector 602 after the optical fibers in the first optical fiber ribbon connector 602 are optically coupled to the silicon optical chip 403.

Figure 18:
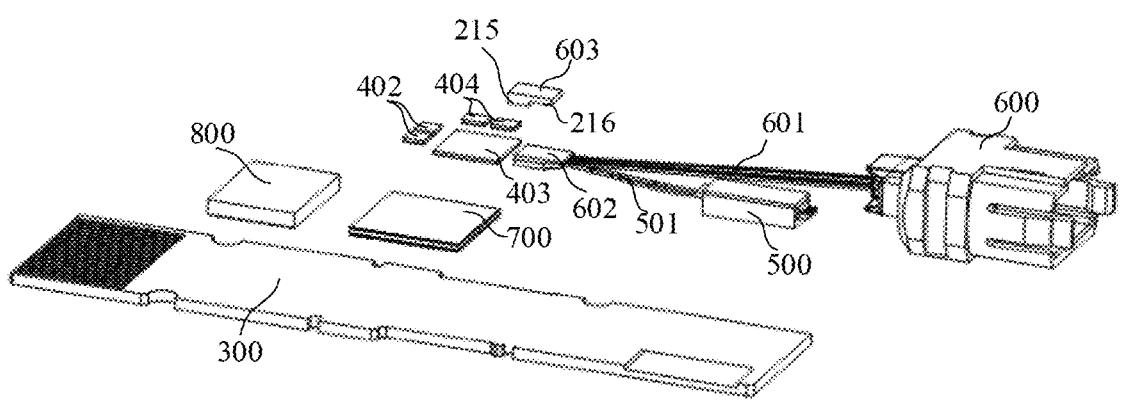
FIG. 18 is a schematic diagram showing structures of a first optical fiber ribbon connector, a silicon optical chip and a connector fixing component that are in a disassembled state, in accordance with some embodiments.
Figure 19:
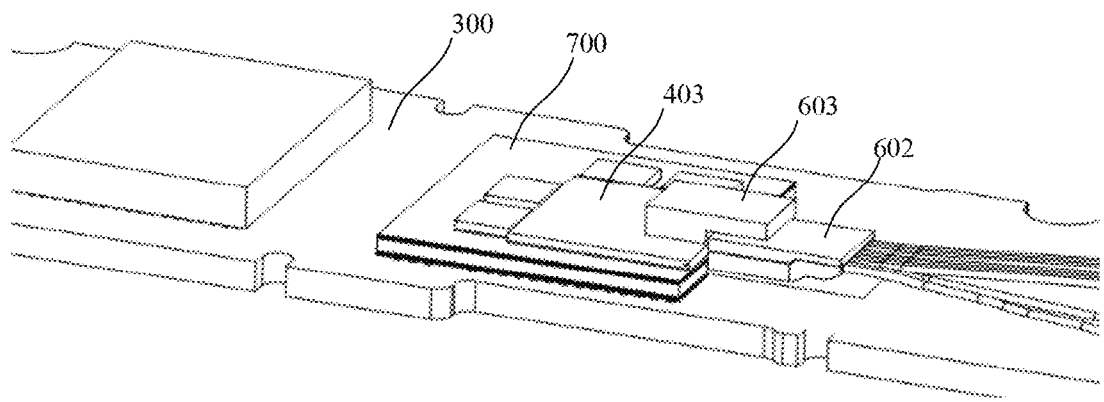
FIG. 19 is a schematic diagram showing an assembly structure of a first optical fiber ribbon connector, a silicon optical chip and a connector fixing component, in accordance with some embodiments.
Figure 20:
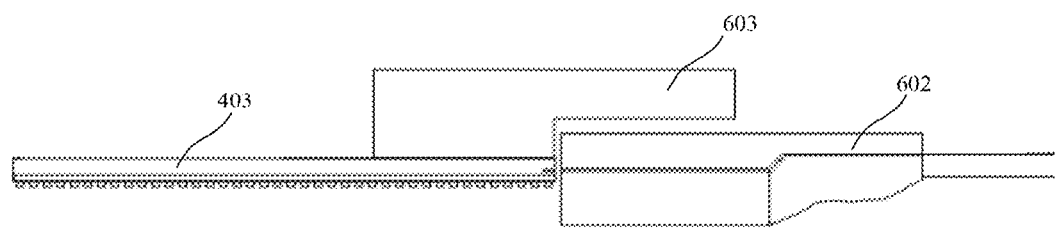
FIG. 20 is a side view of an assembly structure of a first optical fiber ribbon connector, a silicon optical chip and a connector fixing component, in accordance with some embodiments.

FIG. 18 is a schematic diagram showing structures of a first optical fiber ribbon connector, a silicon optical chip and a connector fixing component that are in a disassembled state in accordance with some embodiments; FIG. 19 is a schematic diagram of an assembly structure of a first optical fiber ribbon connector, a silicon optical chip and a connector fixing component in accordance with some embodiments; and FIG. 20 is a side view of an assembly structure of a first optical fiber ribbon connector, a silicon optical chip and a connector fixing component in accordance with some embodiments. As shown in FIGS. 18 to 20, a bottom surface of the connector fixing component 603 proximate to the silicon optical chip 403 includes a first fixing surface 215 and a second fixing surface 216. The first fixing surface 215 is fixed on the upper surface of the silicon optical chip 403, and the second fixing surface 216 is fixed on an upper surface of the first optical fiber ribbon connector 602. The first fixing surface 215 of the connector fixing component 603 is disposed proximate to the side of the silicon optical chip 403 provided with the optical waveguide end facets 4031, and the second fixing surface 216 of the connector fixing component 603 is suspended relative to the silicon optical chip 403. After the optical fibers in the first optical fiber ribbon connector 602 is optically coupled to the silicon optical chip 403, the upper surface of the first optical fiber ribbon connector 602 is fixed on the second fixing surface 216 of the connector fixing component 603, so that a certain gap is formed between the first optical fiber ribbon connector 602 and the circuit board 300. Furthermore, compared to a manner in which the first optical fiber ribbon connector 602 is directly fixed on the circuit board 300, the above fixing manner in which a certain gap is formed between the first optical fiber ribbon connector 602 and the circuit board 300 may eliminate a problem that a position deviation of the first optical fiber ribbon connector 602 due to an uneven surface of the circuit board 300, which otherwise affects an alignment accuracy of the optical waveguide end facets 4031 in the silicon optical chip 403 and the optical fibers in the first optical fiber ribbon connector 602.

In some embodiments, a thermal expansion coefficient of the connector fixing component 603 is less than that of the circuit board 300, and correspondingly, a thermal deformation of the connector fixing component 603 is smaller than that of the circuit board 300. Therefore, during the operation of the optical module 200, the connector fixing component 603 may provide a more stable bearing surface for the first optical fiber ribbon connector 602 and the silicon optical chip 403 fixed thereon, so as to ensure stability of a relative position of the silicon optical chip 403 and the first optical fiber ribbon connector 602, and to further ensure stability of an optical coupling efficiency between the silicon optical chip 403 and the optical fibers clamped in the first optical fiber ribbon connector 602.

In order to further promote the stability of the optical coupling efficiency between the optical waveguide end facets 4031 in the silicon optical chip 403 and the optical fibers in the first optical fiber ribbon connector 602 in the working process of the optical module, an absolute value of a difference between the thermal expansion coefficient of the connector fixing component 603 and a thermal expansion coefficient of the first optical fiber ribbon connector 602, and an absolute value of a difference between the thermal expansion coefficient of the connector fixing component 603 and a thermal expansion coefficient of the silicon optical chip 403 are both less than a preset value. For example, the preset value may be 10 ppm/° C., but is not limited to this value. That is, the connector fixing component 603 is made of a material with a thermal expansion coefficient close to that of the silicon optical chip 403 and the first optical fiber ribbon connector 602, e.g., a material such as glass, ceramics, etc. In some embodiments, the connector fixing component 603 may be made of materials suitable for high-precision processing, such as glass and ceramics, so as to ensure a surface flatness thereof It will be noted that a surface of the connector fixing component 603 configured to be in contact with the silicon optical chip 403 and the first optical fiber ribbon connector 602 is a bottom surface thereof; and a surface of the silicon optical chip 403 and the first optical fiber ribbon connector 602 configured to be in contact with the connector fixing component 603 is an upper surface thereof.

In a production process of the optical module 200, in order to reduce a thickness of the optical module 200 and save raw materials, thicknesses of the circuit adapter board 700 and the silicon optical chip 403 are designed to be as thin as possible; and in order to ensure the firmness of the first optical fiber ribbon connector 602 fixing the optical fibers, the first optical fiber ribbon connector 602 has a certain thickness. Thus, after the first optical fiber ribbon connector 602 is installed, the upper surface of the first optical fiber ribbon connector 602 is higher than the upper surface of the silicon optical chip 403. In order to adapt to this assembly structure of the first optical fiber ribbon connector 602 and the silicon optical chip 403, as shown in FIG. 20, the connector fixing component 603 has an L-shaped structure, that is, the first fixing surface 215 and the second fixing surface 216 form a stepped structure. A height of the second fixing surface 216 relative to the circuit board 300 is greater than a height of the first fixing surface 215 relative to the circuit board 300. The first fixing surface 215 is fixed on the upper surface of the silicon optical chip 403, and the second fixing surface 216 is fixed on the upper surface of the first optical fiber ribbon connector 602.

In order to prevent the optical fibers clamped by the first optical fiber ribbon connector 602 from touching the optical waveguide end facets 4031 of the silicon optical chip 403 during optical coupling to cause abrasion of the silicon optical chip 403 or the optical fibers, in some embodiments of the present disclosure, there is a certain gap between the optical waveguide end facets 4031 of the silicon optical chip 403 and the optical fibers in the first optical fiber ribbon connector 602. In some embodiments, glue is filled between the optical waveguide end facets 4031 of the silicon optical chip 403 and end faces of the optical fibers in the first optical fiber ribbon connector 602, so as to protect the optical waveguide end facets 4031 of the silicon optical chip 403 and the end faces of the optical fibers in the first optical fiber ribbon connector 602, and prevent external contaminants from entering the gap to affect the optical coupling efficiency.

In some embodiments, a refractive index of the glue is greater than that of air and less than that of the optical fibers in the first optical fiber ribbon connector 602, so as to reduce a refractive index difference between the glue and the optical fibers, and to further improve the optical coupling efficiency between the silicon optical chip 403 and the optical fibers. In addition, glue with a good light transmittance, e.g., glue with a light transmittance of above 90% is selected, to reduce an absorption to light.

Figure 21:
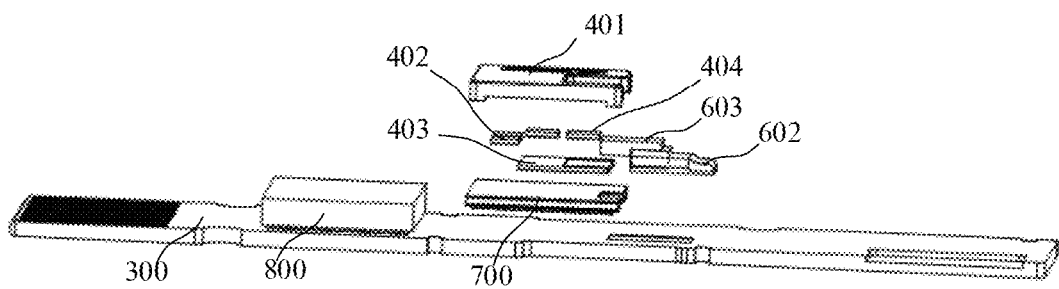
FIG. 21 is a schematic diagram showing structures of a circuit board, a circuit adapter board, a silicon optical chip and a protective cover that are in a disassembled state, in accordance with some embodiments.
Figure 22:
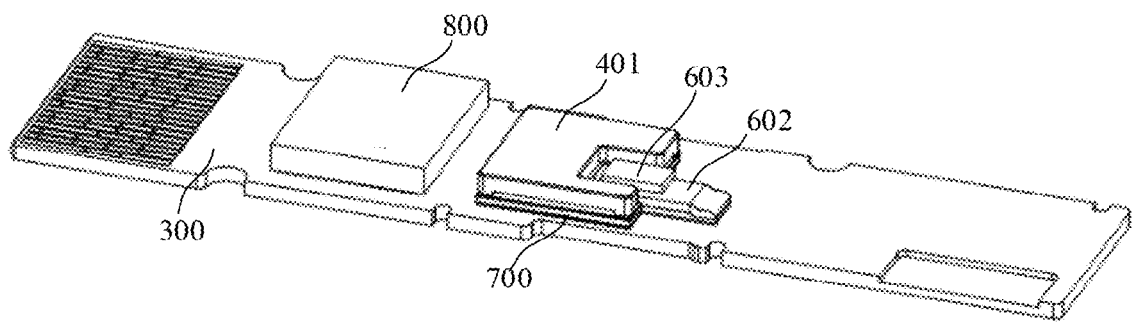
FIG. 22 is a schematic diagram showing an assembly structure of a circuit board, a circuit adapter board, a silicon optical chip and a protective cover, in accordance with some embodiments.

In order to achieve electromagnetic shielding of the silicon optical chip 403, the silicon optical chip 403 is protected by a protective cover 401 in some embodiments. FIG. 21 is a schematic diagram showing structures of a circuit board, a circuit adapter board, a silicon optical chip and a protective cover that are in a disassembled state in accordance with some embodiments, and FIG. 22 is a schematic diagram of an assembly structure of a circuit board, a circuit adapter board, a silicon optical chip and a protective cover in accordance with some embodiments. As shown in FIGS. 21 and 22, the optical module 200 further includes a protective cover 401, and the protective cover 401 is a hard shell structure and may be made of a metal material. In some embodiments, the protective cover 401 is fixed on the circuit adapter board 700, the protective cover 401 includes an inner surface and an outer surface, and the inner surface faces the circuit adapter board 700 and forms a cavity structure with the circuit adapter board 700. The driver chip 402 and the trans-impedance amplifier 404 are disposed in the cavity structure formed by the protective cover 401 and the circuit adapter board 700. In order to facilitate the installation of the connector fixing component 603, a portion of the silicon optical chip 403 is disposed in the cavity structure, and the other portion thereof is located outside the cavity structure. Of course, if the silicon optical chip 403 is assembled with the light source 500 and the optical fiber socket 600 in other manners, the silicon optical chip 403 may also be completely covered in the protective cover 401.

In some embodiments, in order to help heat dissipation of the components covered in the cavity structure, the outer surface of the protective cover 401 is in thermally conductive contact with an inner surface of the upper shell 201 of the optical module 200. For example, the two surfaces may be in thermally conductive contact with each other in a direct abutting manner, and the two surfaces may also be in thermally conductive contact with each other through a thermally conductive glue.

In addition, if one or more of the driver chip 402, the trans-impedance amplifier 404 and the silicon optical chip 403 are connected to the circuit adapter board 700 by wire bonding, the protective cover 401 may also protect the connecting wires to avoid damage to the same due to extrusion or touch. The protective cover 401 covers a wire bonding region of the silicon optical chip 403. That is, the wire bonding region is wrapped in the cavity structure formed by the protective cover 401 and the circuit adapter board 700 to achieve the purpose of protecting the connecting wires.

Some optical components (e.g., lenses) are generally provided in the light source 500 to realize functions such as collimation of an optical path. These optical components require high surface cleanliness, and thus in order to protect these optical components, the light source 500 generally includes a closed box, in which these optical components are disposed. However, the box has a large thickness, which makes the light source 500 have a large height. Whereas the silicon optical chip 403 is disposed on the circuit board 300 through the circuit adapter board 700, and a thickness of the circuit adapter board 700 is small. Therefore, there is a certain height difference between the light source 500 and the silicon optical chip 403.

Figure 23:
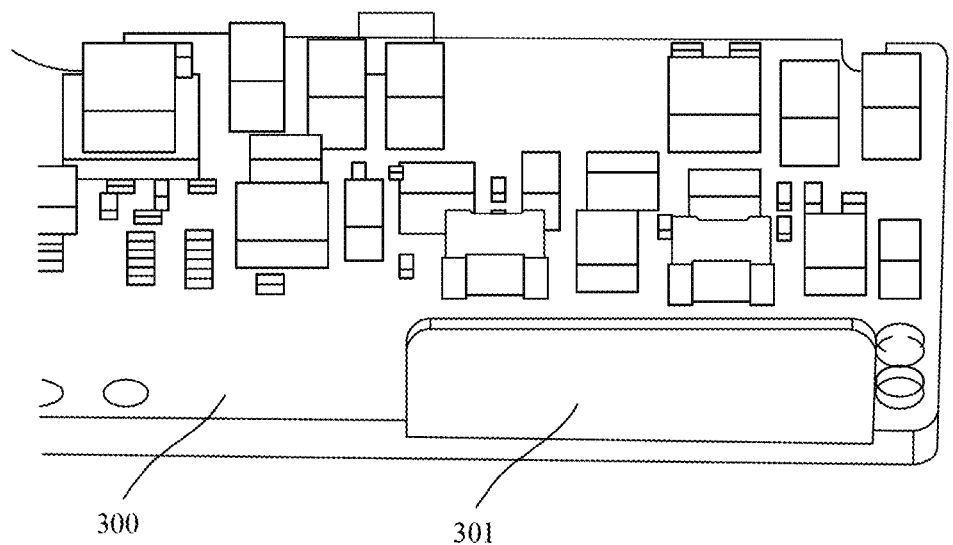
FIG. 23 is a schematic diagram showing a partial structure of a circuit board, in accordance with some embodiments.

In order to reduce the height difference to facilitate the optical connection between the light source 500 and the silicon optical chip 403, as shown in FIG. 23, in some embodiments of the present disclosure, the circuit board 300 further includes a recess 301, in which the light source 500 is disposed. Based on the above height difference between a light outlet of the light source 500 and the optical waveguide end facets 4031 of the silicon optical chip 403, a depth of the recess 301 is set to 100 μm to 150 μm, such as 110 μm, 120 μm, 125 μm, 130 μm, 135 μm or 140 μm. Of course, the depth of the recess 301 is not limited to the above numerical range. The arrangement of the recess 301 may also facilitate positioning of the light source 500 in the assembly process of the optical module 200.

A connection mode of the light source 500 and the circuit board 300 is not limited. The light source 500 may be electrically connected to the circuit board 300 by wire bonding, or may be electrically connected to the circuit board 300 through a flexible circuit board.

The arrangement of the light source 500 is not limited. The light source 500 may be disposed on the upper surface of the silicon optical chip 403, on a surface of the circuit board 300, or at a position other than the circuit board 300 (e.g., on the shell of the optical module 200).

The light source 500 also generates a large amount of heat in a working process thereof. However, the silicon optical chip 403 has a limited heat dissipation efficiency, and conventional structural design or material changes have difficulty in significantly increasing the heat dissipation efficiency of the silicon optical chip 403. Therefore, diffusing the heat generated by the light source 500 through the silicon optical chip 403 will undoubtedly increase a heat dissipation burden of the silicon optical chip 403. In particular, for the optical module 200 performing high-speed signal transmission (e.g., signal transmission at a rate of 100 Gb/s, 400 Gb/s or 1040 Gb/s), a design that the heat generated by the light source 500 is diffused by the silicon optical chip 403 is not preferable. Therefore, in some embodiments of the present disclosure, the light source 500 is disposed on the surface of the circuit board 300 or at a position other than the circuit board 300, thereby eliminating an influence of the light source 500 on an operating performance of the silicon optical chip 403. In addition, the arrangement of the light source 500 on the surface of the circuit board 300 may also reduce the overall thickness of the optical module 200.

Based on a fact that monochromaticity of a laser is relatively good, the light source 500 may be a laser light source. The light source 500 may be designed in a form of a laser box, and optical components such as a laser chip and a focusing lens may be provided in a box of the light source 500. The laser chip emits laser light, which is not modulated and does not carry information, and the laser light emitted by the laser chip is output to the silicon optical chip 403 after passing through optical components such as the focusing lens.

Figure 24:
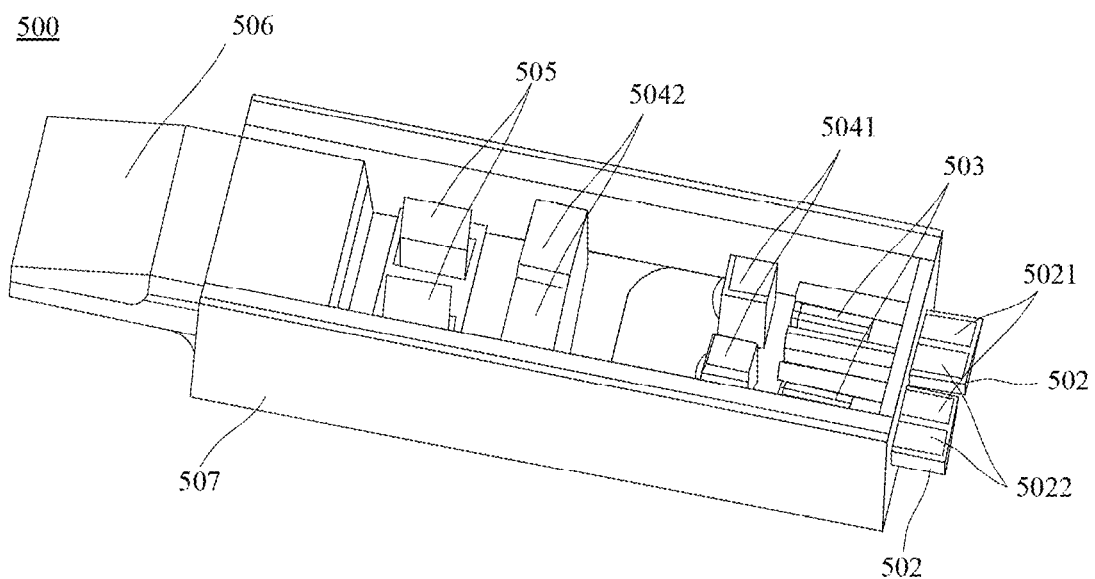
FIG. 24 is a schematic diagram showing a structure of a light source, in accordance with some embodiments.

FIG. 24 is a schematic diagram showing a structure of a light source in accordance with some embodiments. As shown in FIG. 24, the light source 500 includes a box 507, and an insulating substrate 502, a laser chip 503, a first lens 5041, a second lens 5042 and an isolator 505 located inside the shell 507.

The box 507 may be made of a metal material, e.g., copper, so as to facilitate heat dissipation of optical components inside the box 507. It will be noted that the box 507 in FIG. 24 is a box with an upper box removed.

The number of optical paths included in the light source 500 is not limited, and the light source 500 may include one, two or more optical paths. FIG. 24 shows that the light source 500 includes two optical paths, that is, the number of insulating substrates 502, laser chips 503, first lenses 5041, second lenses 5042 and isolators 505 are all two.

The insulating substrate 502 is disposed at a bottom of the box 507, and a portion of the insulating substrate 502 extends out of the box 507. The laser chip 503 is disposed on a surface of the insulating substrate 502. In order to enable the insulating substrate 502 to provide a flat bearing surface for the laser chip 503 disposed thereon, the insulating substrate 502 may be made of materials suitable for high-precision processing, such as aluminum nitride and aluminum oxide.

A first metal layer 5021 and a second metal layer 5022 that are independent of each other are formed on the surface of the insulating substrate 502. An anode of the laser chip 503 is electrically connected to the first metal layer 5021, and a cathode of the laser chip 503 is electrically connected to the second metal layer 5022. The anode and the cathode of the laser chip 503 may be located on the same surface of the laser chip 503 or on different surfaces of the laser chip 503. For example, the anode and the cathode are located on an upper surface and a lower surface of the laser chip 503, respectively.

The first lens 5041 and the second lens 5042 are sequentially disposed on a light-emitting side of the laser chip 503, and a laser beam emitted by the laser chip 503 is sequentially collimated by the first lens 5041 and the second lens 5042 to form a collimated laser beam. The collimated laser beam is transmitted to the isolator 505 and then transmitted to the second optical fiber ribbon 501 through the isolator 505.

In order to facilitate coupling of the laser beam from the isolator 505 to the second optical fiber ribbon 501, the optical module 200 further includes a second optical fiber ribbon connector 506, and the second optical fiber ribbon connector 506 is configured to clamp an end of the second optical fiber ribbon 501 connected to the light source 500. The second optical fiber ribbon connector 506 is disposed at the bottom of the box 507, and one end of the second optical fiber ribbon connector 506 is located outside the shell 507 and the other end thereof is located inside the shell 507, so as to realize optical connection between the laser chip 503 and the second optical fiber ribbon 501.

Compared with a manner in which the second optical fiber ribbon 501 is directly coupled to the laser chip 503, the manner in some embodiments of the present disclosure in which the end of the second optical fiber ribbon 501 connected to the light source 500 is clamped through the second optical fiber ribbon connector 506 may ensure stability of a relative position of the second optical fiber ribbon 501 and the laser chip 503, thereby ensuring stability of an optical coupling efficiency between the second optical fiber ribbon 501 and the laser chip 503.

A structure of the second optical fiber ribbon connector 506 is similar to that of the first optical fiber ribbon connector 602, and will not be repeated herein.

In some embodiments, the light source 500 has only one of the first lens 5041 and the second lens 5042.

Figure 25:
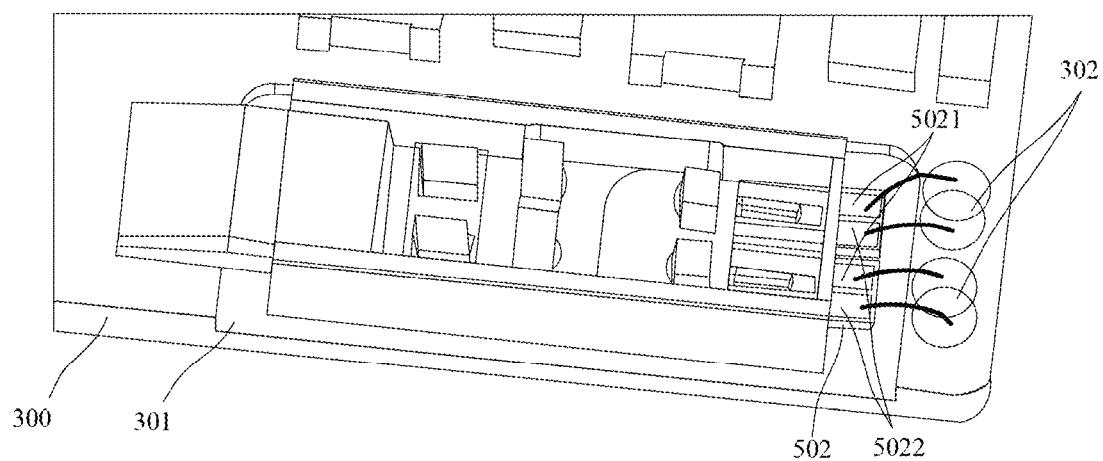
FIG. 25 is a schematic diagram showing an assembly structure of the light source shown in FIG. 24 and a circuit board.

FIG. 25 is a schematic diagram showing an assembly structure of the light source that is shown in FIG. 24 and a circuit board. As shown in FIG. 25, the circuit board 300 further includes laser driving pads 302, and the metal layers 5021 and 5022 on the surface of the insulating substrate 502 is electrically connected to the laser driving pads 302 by wire bonding. The connecting wire used for wire bonding is a gold wire. In this way, a driving signal output by the circuit board 300 may be transmitted to the laser chip 503 through the insulating substrate 502, so that the laser chip 503 outputs a laser beam.

Figure 26:
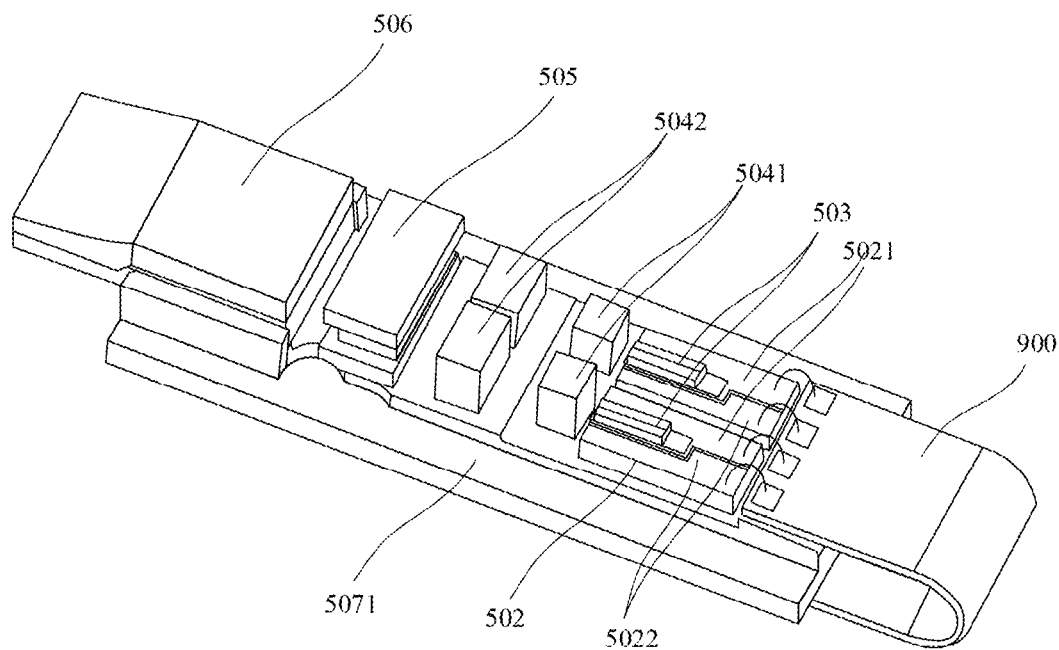
FIG. 26 is a schematic diagram showing another structure of a light source, in accordance with some embodiments.
Figure 27:
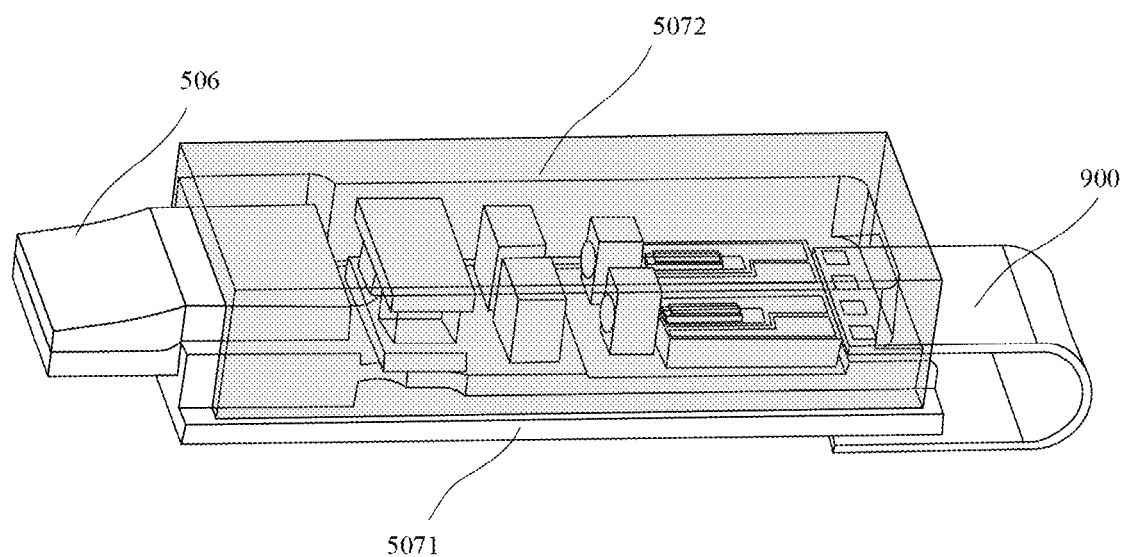
FIG. 27 is a schematic diagram showing a structure of the light source shown in FIG. 26 including an upper box.

FIG. 26 is a schematic diagram showing another structure of a light source in accordance with some embodiments, and FIG. 27 is a schematic diagram showing a structure of the light source shown in FIG. 26 including an upper box. One of the differences between the light source 500 shown in FIGS. 26 and 27 and the light source 500 in FIGS. 24 and 25 is that the box 507 of the light source 500 shown in FIGS. 26 and 27 includes an upper box 5072 and a lower box 5071.

The upper box 5072 includes a cover plate and two side plates located on both sides of the cover plate respectively and disposed perpendicular to the cover plate; and the lower box 5071 includes a bottom plate, and the upper box 5072 is snapped onto the lower box 5071. The lower box 5071 is provided with the insulating substrate 502, the laser chip 503, the first lens 5041, the second lens 5042 and the isolator 505. In order to make the laser chip 503, the first lens 5041, the second lens 5042 and the isolator 505 located on the same optical axis, an upper surface of the lower box 5071 has different relative heights to bear the above optical components.

In some embodiments, the light source 500 has only one of the first lens 5041 and the second lens 5042.

The light source 500 is electrically connected to the circuit board 300 through a flexible circuit board 900. One end of the flexible circuit board 900 extends into the box 507 to be electrically connected to the metal layers 5021 and 5022 on the surface of the insulating substrate 502, and the other end of the flexible circuit board 900 is located outside the box 507. In order to facilitate electrical connection between the flexible circuit board 900 and the metal layers 5021 and 5022 on the surface of the insulating substrate 502, bonding pads are provided on the end of the flexible circuit board 900 extending into the box 507, and the bonding pads are electrically connected to the metal layers 5021 and 5022 on the surface of the insulating substrate 502 through wire bonding.

Figure 28:
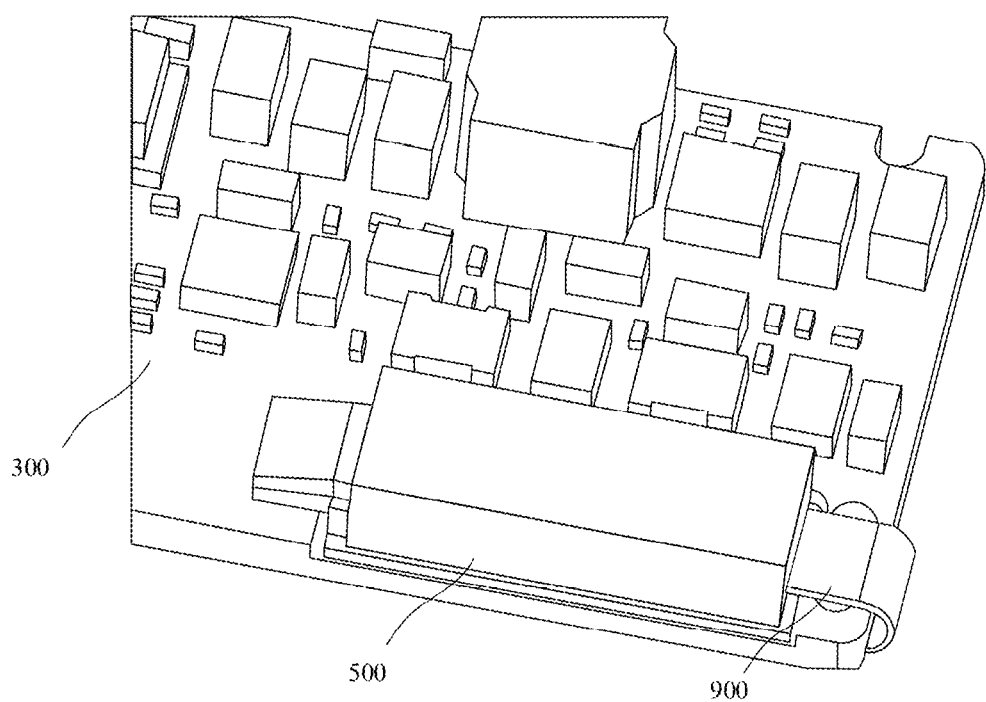
FIG. 28 is a schematic diagram showing an assembly structure of the light source shown in FIG. 27 and a circuit board.

FIG. 28 is a schematic diagram showing an assembly structure of the light source shown in FIG. 27 and a circuit board. As shown in FIG. 28, the light source 500 is disposed on an upper surface of the circuit board 300, and laser driving pads are provided on a lower surface of the circuit board 300. After being bent, the flexible circuit board 900 bypasses a side face of the circuit board 300 to be electrically connected to the laser driving pads. The laser driving pads is connected to the flexible circuit board 900 by wire bonding. In this way, the driver signal output by the circuit board 300 may be transmitted to the laser chip 503 through the flexible circuit board 900, so that the laser chip 503 outputs a laser beam.

In some embodiments of the present disclosure, in order to facilitate connection between the light source 500 and the circuit board 300, shorten a length of the wiring in the flexible circuit board 900 and reduce an influence of the flexible circuit board 900 on other components on the circuit board 300, the light source 500 is disposed on a long side of the circuit board 300 and near a corner.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An optical module having an optical port and an electrical port, the optical module comprising:
    a shell;
    a circuit board disposed in the shell, an end of the circuit board being provided with a connecting finger, and the connecting finger being located in the electrical port;
    a circuit adapter board disposed on the circuit board and electrically connected to the circuit board, a thermal expansion coefficient of the circuit adapter board being lower than that of the circuit board;
    a silicon optical chip disposed on the circuit adapter board and electrically connected to the circuit adapter board;
    a light source disposed on the circuit board, and electrically connected to the circuit board and optically connected to the silicon optical chip; and
    an optical fiber socket optically connected to the silicon optical chip and configured to form the optical port.

2. The optical module according to claim 1, wherein a thermal conductivity of the circuit adapter board is greater than a thermal conductivity of the circuit board.

3. The optical module according to claim 1, wherein
    the circuit adapter board includes: first bonding pads disposed on a surface of the circuit adapter board proximate to the silicon optical chip, second bonding pads disposed on a surface of the circuit adapter board away from the silicon optical chip, and internal wiring connecting the first bonding pads and the second bonding pads;
    the silicon optical chip includes third bonding pads disposed on a surface of the silicon optical chip proximate to or away from the circuit adapter board; and
    the silicon optical chip is electrically connected to the circuit adapter board through the first bonding pads and the third bonding pads, and the circuit adapter board is electrically connected to the circuit board through the second bonding pads.

4. The optical module according to claim 1, further comprising:
    a driver chip disposed on the circuit adapter board, and being electrically connected to the circuit adapter board and the silicon optical chip; and
    a trans-impedance amplifier disposed on the circuit adapter board, and being electrically connected to the circuit adapter board and the silicon optical chip.

5. The optical module according to claim 4, wherein
    the driver chip and the trans-impedance amplifier are electrically connected to the silicon optical chip through corresponding internal wiring in the circuit adapter board, respectively.

6. The optical module according to claim 1, wherein the silicon optical chip includes optical waveguide end facets disposed on a side of the silicon optical chip;
    the optical waveguide end facets include a plurality of first light inlet waveguide end facets, a plurality of second light inlet waveguide end facets, and a plurality of light outlet waveguide end facets; and
    the silicon optical chip receives light of the light source through the plurality of first light inlet waveguide end facets and modulates the light, and transmits an optical signal obtained after modulation to an outside of the optical module through the plurality of light outlet waveguide end facets; and the silicon optical chip also receives an optical signal outside the optical module through the plurality of second light inlet waveguide end facets.

7. The optical module according to claim 6, wherein a side of the silicon optical chip provided with the optical waveguide end facets is located near an edge of the circuit adapter board proximate to the optical port; and
    the circuit adapter board further includes a notch located on a side of the circuit adapter board proximate to the optical waveguide end facets, and the silicon optical chip is bridged over the notch.

8. The optical module according to claim 7, wherein there is a distance between the side of the silicon optical chip provided with the optical waveguide end facets and the side of the circuit adapter board provided with the notch; and the side of the circuit adapter board provided with the notch is closer to or farther away from the optical port than the side of the silicon optical chip provided with the optical waveguide end facets.

9. The optical module according to claim 7, wherein the side of the silicon optical chip provided with the optical waveguide end facets is flush with the side of the circuit adapter board provided with the notch.

10. The optical module according to claim 6, further comprising:
a first optical fiber ribbon, wherein one end of the first optical fiber ribbon is optically connected to the silicon optical chip, and another end of the first optical fiber ribbon is optically connected to the optical fiber socket;
a second optical fiber ribbon, wherein one end of the second optical fiber ribbon is optically connected to the silicon optical chip, and another end of the second optical fiber ribbon is optically connected to the light source;
a first optical fiber ribbon connector configured to clamp the end of the first optical fiber ribbon and the end of the second optical fiber ribbon that are optically connected to the silicon optical chip; and
a second optical fiber ribbon connector configured to clamp the end of the second optical fiber ribbon optically connected to the light source.

11. The optical module according to claim 10, wherein the first optical fiber ribbon connector includes:
a first fixing component including a first clamping surface and a second clamping surface;
a second fixing component including a third clamping surface, and the third clamping surface cooperates with the first clamping surface to clamp first optical fiber segments of the first optical fiber ribbon and the second optical fiber ribbon; and
a third fixing component including a fourth clamping surface, and the fourth clamping surface cooperates with the second clamping surface to clamp second optical fiber segments of the first optical fiber ribbon and the second optical fiber ribbon.

12. The optical module according to claim 11, wherein a plurality of grooves are provided on the first clamping surface, and an arrangement density of the plurality of grooves corresponds to that of the optical waveguide end facets;
the third clamping surface cooperates with the first clamping surface to fix optical fibers of the first optical fiber ribbon and the second optical fiber ribbon in corresponding grooves.

13. The optical module according to claim 10, further comprising a connector fixing component, wherein
the connector fixing component is configured to fix the first optical fiber ribbon connector and the silicon optical chip after optical fibers in the first optical fiber ribbon connector is optically connected to the silicon optical chip.

14. The optical module according to claim 13, wherein the connector fixing component includes a first fixing surface and a second fixing surface, and the first fixing surface and the second fixing surface are in a stepped shape; and
the first fixing surface is fixed on a surface of the silicon optical chip away from the circuit adapter board, the second fixing surface is fixed on a surface of the first optical fiber ribbon connector away from the circuit board, and there is a gap between the circuit board and a surface of the first optical fiber ribbon connector proximate to the circuit board.

15. The optical module according to claim 14, wherein a thermal expansion coefficient of the connector fixing component is less than the thermal expansion coefficient of the circuit board.

16. The optical module according to claim 14, wherein an absolute value of a difference between the thermal expansion coefficient of the connector fixing component and a thermal expansion coefficient of the first optical fiber ribbon connector is less than a preset value; and/or
an absolute value of a difference between the thermal expansion coefficient of the connector fixing component and a thermal expansion coefficient of the silicon optical chip is less than the preset value.

17. The optical module according to claim 10, wherein there is a gap between the optical waveguide end facets and the first optical fiber ribbon connector, and the gap is filled with glue; and
a refractive index of the glue is greater than that of air, and is less than that of optical fibers in the first optical fiber ribbon connector.

18. The optical module according to claim 1, further comprising:
a driver chip disposed on the circuit adapter board, and being electrically connected to the circuit adapter board and the silicon optical chip; and
a trans-impedance amplifier disposed on the circuit adapter board, and being electrically connected to the circuit adapter board and the silicon optical chip;
a protective cover, wherein the protective cover and the circuit adapter board form a cavity; the driver chip and the trans-impedance amplifier are both located in the cavity; a portion of the silicon optical chip is located in the cavity, and another portion of the silicon optical chip is located outside the cavity.

19. The optical module according to claim 18, wherein the protective cover is in thermally conductive contact with the shell.

20. The optical module according to claim 1, wherein the circuit board includes a light source recess, and the light source is disposed in the light source recess.

* * * * *